United States Patent [19]
Young et al.

[11] Patent Number: 6,092,993
[45] Date of Patent: Jul. 25, 2000

[54] ADJUSTABLE CRANKPIN THROW STRUCTURE HAVING IMPROVED THROW STABILIZING MEANS

[75] Inventors: Michael R. Young; Joseph F. Loprete, both of Bristol, Tenn.; David T. Monk, Lebanon, Va.; Philip C. Wagner, Bristol, Tenn.; Joe T. Hill; Robert B. Peters, both of Bristol, Va.

[73] Assignee: Bristol Compressors, Inc., Bristol, Va.

[21] Appl. No.: 08/911,481

[22] Filed: Aug. 14, 1997

[51] Int. Cl.[7] .................................................. F04B 1/06
[52] U.S. Cl. ........................... 417/53; 417/315; 417/221; 417/539
[58] Field of Search .............................. 417/53, 312, 315, 417/539, 547, 552, 221; 92/13.3

[56] References Cited

U.S. PATENT DOCUMENTS

| | | | |
|---|---|---|---|
| 4,031,778 | 6/1977 | Fazekas | 74/571 |
| 4,236,874 | 12/1980 | Sisk | 417/315 |
| 4,242,626 | 12/1980 | Gross | 318/772 |
| 4,245,966 | 1/1981 | Riffe | 417/539 |
| 4,248,053 | 2/1981 | Sisk | 62/158 |
| 4,396,359 | 8/1983 | Kropiwnicki | 417/312 |
| 4,479,419 | 10/1984 | Wolfe | 92/13.3 |
| 4,494,447 | 1/1985 | Sisk | 92/13.3 |
| 4,503,371 | 3/1985 | Sugita | 318/443 |
| 4,566,289 | 1/1986 | Iizuka | 62/228.4 |
| 4,598,764 | 7/1986 | Beckey . | |
| 4,718,247 | 1/1988 | Kobayashi et al. | 62/228.4 |
| 4,838,769 | 6/1989 | Gannaway | 417/312 |
| 4,879,502 | 11/1989 | Endo et al. . | |
| 4,963,075 | 10/1990 | Albertson et al. . | |
| 5,070,932 | 12/1991 | Vlasak . | |
| 5,080,130 | 1/1992 | Terwilliger et al. | 137/512 |
| 5,106,278 | 4/1992 | Terwilliger et al. | 417/547 |
| 5,129,792 | 7/1992 | Abousabha | 417/312 |
| 5,201,640 | 4/1993 | Heinzelmann et al. | 417/372 |
| 5,203,857 | 4/1993 | Terwilliger et al. | 417/552 |
| 5,252,905 | 10/1993 | Wills et al. | 318/807 |
| 5,592,059 | 1/1997 | Archer . | |
| 5,619,860 | 4/1997 | Yuji et al. . | |
| 5,780,990 | 7/1998 | Weber . | |

FOREIGN PATENT DOCUMENTS

| | | |
|---|---|---|
| 0 547351 A2 | 6/1993 | European Pat. Off. . |
| 3138812 | 4/1983 | Germany . |
| 4322223 | 1/1995 | Germany . |

Primary Examiner—Charles G. Freay
Attorney, Agent, or Firm—Finnegan, Henderson, Farabow, Garrett & Dunner, L.L.P.

[57] ABSTRACT

A stabilizing structure for a throw adjusting eccentric cam in a two-stage reciprocating compressor is provided. The compressor includes a block that has at least one cylinder with an associated compression chamber and piston, a crankshaft that includes an eccentric crankpin, and a reversible motor for rotating the crankshaft in a forward and a reverse direction. An eccentric, two position cam is rotatably mounted over the crankpin. The cam rotates to and operates at a first position relative to said crankpin when the motor is running in the forward direction and rotates to and operates at a second position relative to said crankpin when the motor is running in the reverse direction. The combined eccentricities of the crankpin and the cam cause the piston to have a first stroke when the motor operates in the forward direction and a second stroke when the motor operates in the reverse direction. There is also provided a control for selectively operating the motor either in the forward direction or in the reverse direction.

46 Claims, 18 Drawing Sheets

ADJUSTABLE CRANKPIN THROW STRUCTURE HAVING IMPROVED THROW STABILIZING MEANS

BACKGROUND OF THE INVENTION

1. Field

The present invention is concerned with switching the stroke length of one or more reciprocating pistons of machines including reciprocating gas compressors and vacuum or other pumps and other devices including scotch yoke compressors such as shove in U.S. Pat. No. 4,838,769, in which the reciprocating motion of the pistons is effected by the orbiting of crankpins which are attached to said pistons by connecting rods or other connecting structures hating bearings rotatably mounted on said crankpins.

In particular, the invention concerns gas compressors, especially multi-cylinder refrigerant compressors, in which the connecting rod bearing of at least one piston is mounted on an eccentric cam rotatably mounted on the crankpin. This cam is angularly adjustable by reversal of the crankshaft drive motor and thus the crankshaft rotation to switch to either a lengthened or shortened crankpin throw and piston stroke, depending, by design, on the direction of rotation of the crankshaft Such stroke or throw switching can be engineered to give desired high pressure refrigerant output capacities such that the compressor efficiency can be maintained more easily under markedly varying load requirements.

Another and preferred aspect of the invention concerns a unique electrical circuitry for operating the crankshaft drive motor, whereby reversal of the motor for reducing or eliminating the throw takes the motor off the normal run winding and places it on a more efficient winding of reduced current capacity in particular, the start minding.

2. Prior Art

Throw switching structures for which the present invention finds particular application are shown and described in U.S. Pat. Nos.: 4,479,419; 4,236,874; 4,494,447; 4,245,966; and 4,248,053, the disclosures of which with respect to general compressor construction and also with respect to particular structures of cylinder, piston, crankshaft, crankpin and throw shifting mechanisms are hereby incorporated herein by reference in their entirety. With respect to these patents the crankpin journal is complex and comprised of an inner and one or more outer eccentrically configured journals, said inner journal being the outer face of the crankpin shaft, and the outer journal(s) being termed "eccentric cams or rings" in these patents, and being rotatable mounted or stacked on said inner journal. The bearing of the connecting rod is rotatably mounted on the outer face of the outermost journal.

In these patents, as in the present invention, all journal and bearing surfaces of the power transmission train of the shiftable throw piston from the crankshaft to the connecting rod are conventionally circular and allow structurally unhindered rotative motion, within design limits, of the outer journal(s) on the inner journal and of the connecting rod bearing on the outermost journal. This rotative motion, in either direction, will, thru the eccentricity of the outer journal surface of the outermost journal relative to its inner bearing surface, shift the radial distance of the orbital axis of the crankpin from the axis of rotation of the crankshaft and thus change the throw of the crankpin and the stroke of the piston. The present invention will be described below in reference to a single cam mounted on a crankpin shaft.

As described in, e.g., said U.S. Pat. No. 4,479,419 and with reference to the structure numbering therein, the angular positioning of the cam 38 on the crankpin 34 is accomplished by providing a pair of drive stops (not numbered in the said U.S. Pat. No. 4,479,419, but numbered 58, 60 in the U.S. Pat. No. 4,494,447 as "end points") which are angularly spaced on a portion of the crankshaft such as the crankpin 34, and a driven dog 48 provided on the cam 38. These stops and the dog are angularly positioned with respect to each other such that upon rotation of the crankshaft in one direction one of the stops will first engage one side of the dog and rotate cam 38 to a first prescribed angular position on the crankpin to produce one piston stroke length. Conversely, reversing the rotation of the crankshaft still terminate this first engagement and cause the other of the stops to rotate to and engage an opposite side of the dog and rotate the cam to a second prescribed angular position on the crankpin to produce another piston stroke length. These angular positions are alternatively characterized herein as "end point(s)" or "dog-stop" junction(s) or "contact junction (s)", all hereinafter termed "junction(s)".

It is noted that at least a portion of the rotation of the cam relative to the crankpin to either of its endpoints can also result from the inertia of the cam or the rotational drag of the strap end bearing of the connecting rod acting on the outer journal surface of the cam.

It is apparent that for a given fixed crankpin throw the maximum possible magnitude of the piston stroke shift will depend on the degree of eccentricity between inner bearing surface and the outer journal surface of the cam. A larger eccentricity will allow an increased or reduced throw depending on the angular position of the cam on the crankpin. Therefore, a properly configured eccentricity will allow the said orbital axis of the crankpin to become coincident Faith the axis of the crankshaft, thus bringing the crankpin throw and the piston stroke to zero, and thus pacifying the throw, piston and cylinder. It is noted that in this zero stroke or passive mode, the completely pacified piston will remain, theoretically, one halfway between its normal top dead center and normal bottom dead center positions during further operation of the compressor in the reduced capacity mode.

It is to be particularly noted, that as mentioned above, all of the journals and bearings involved in this power transmission train are essentially perfectly circular within, of course, modern machining capability, and their rotational contacts with one another are practically frictionless. Thus arises the conundrum that if only one side of the dog is in engagement with a stop at any given time, what is to prevent disengagement of the junction and the consequent rotation of the cam on the crankpin during periods when the cam is being driven by the stop with only minimal force? Such a disengagement would produce a plethora of unplanned piston strokes, which of course would significantly thwart the effort to maintain maximum compressor efficiency under varying load requirements. The apparent answer is that the junction can be maintained simply by the inertia of the cam during such periods.

Applicants extensive experimentation however, with such complex crankpin journals under typical compressor operating conditions has confirmed that such cam inertia is essentially ineffective to prevent disengagement, i.e., instability of the junction and the throw shift under the dynamic forces present, even in a theoretically completely pacified cylinder.

Taking, for example, the particular case wherein the cam has been rotated on the crankpin to produce a zero piston stroke, any significant "incidental" pressure above ambient, i.e., above the low pressure side of the compressor, developed in the pacified compression chamber by, e.g., high pressure gas leakage across the discharge valve, will act on the piston and connecting rod and cause the cam to rotate on the crankpin at least within the first quadrant (see FIG. 3) and disengage the junction. Such disengagement can range rapidly from barely detectable to several degrees and result in the generation of unwanted piston strokes of various lengths. Also, a further and quite severe problem resulting from such disengagement which our investigations have revealed is that of the generation of considerable metallic clacking or clicking noise generated by the rapid and forceful reengagement of the stop and dog, particularly in the second quadrant, as the disengagement angle declines to zero with a drop in said incidental pressure towards or even below ambient.

Further, taking the case where a previously completely pacified piston has become filly stroked by reversal of the crankshaft rotation, incidental pressure applied to the piston on the inception of its suction stroke by way of compressed gas which was not discharged on the compression stroke, i.e., reexpansion gas, will tend to cause an essentially immediate disengagement of the junction in the first quadrant. This disengagement can then be continued and perhaps amplified in the second quadrant as the linear velocity of the crankpin declines for the bottom dead center turn while the linear inertia of the combined masses of the piston and connecting rod maintains a rotating force on the cam and tends to advance it and the dog further beyond the stop. Under such conditions, the eventual reengagement of the stop and dog in a late section of the second quadrant is with substantial momentum and impact.

Still another major contributor to junction instability is that immediately upon completion of the bottom dead center turn of the crankpin, the diminished pressure existing in the compression chamber will allow the ambient pressure to rapidly force the piston further into the cylinder and thereby rotate the cam in advance of the stop and cause a substantial degree of disengagement. Then, as the pressure in the compression chamber rapidly increases on the compression stroke, the linear velocity, of the piston rapidly declines relative to the orbital velocity of the crankpin and the stop catches up with and impacts against the dog, with considerable force and noise.

Referring to the aforementioned patents, only the U.S. Pat. No. 4,494,447 even alludes to any destabilizing phenomena, and then only with a glancing mention in column one that gas thrust, piston rod inertia, and centrifugal and gas torque reversal forces contribute to cam instability. In what context and in what relationship however, to, e.g., a zero stroke piston mode is not readily apparent from this patent. Also, in column one of that patent it is stated that "forces which generally tend to prevent the possibility of oscillation are friction forces, viscous drag loads, and cam inertia forces." This statement appears to be a recitation of those forces which are inherently present, in varying degrees, in all refrigeration compressors, and sheds no light on a solution to the instability problem, particularly with respect to a zero piston stroke mode.

This patent then goes on to disclose an actual stabilizing structure constituting its invention, which structure is characterized as aiding in holding the cam in the desired position. This structure comprises end stops 58, 60 which are preferably spaced about 270° apart such that a substantial centrifugal force torque "CFT" will develop tending to maintain the stops and dog in contact at the endpoints of the cam rotation, as shown in FIGS. 4 and 5 of the patent.

Also as disclosed in this patent, this CFT can be generated by repositioning the center of mass 62 of the cam away from the throw axis which passes thru the crankshaft axis 30*a* and the crankpin axis 32*a*, as shown in FIGS. 6 and 7 of the patent. It is particularly noted that the stabilizing structure of this patent is not intended to, nor can it function to provide a zero stroke piston mode. Further, it has been Applicants' experience that even where a reduced stroke is to be provided, a CFT solution is inadequate to prevent junction destabilization and unacceptable noise in conventional compressor operations. Obviously, as used herein, the CFT generated by this patent and by the present structure is a CFT which tends to make, rather than break the junction(s).

OBJECTS OF THE INVENTION

Objects therefore of the present invention therefore, are: to provide a crankpin throw shifting structure for at least one crankpin of a multicylinder compressor, which structure does not respond to destabilizing forces developed during either the passive or active mode of the piston operation and which thereby eliminates noise which otherwise would be generated by repeated remakings of the stop—dog junction during operations in either of said modes; to provide said stabilizing structure whereby in the passive mode the piston has essentially zero piston stroke; to provide such stabilizing structure which requires little alteration of existing compressors of the type herein concerned; and to provide a markedly more efficient drive motor reversing means for compressor operations alternating between full capacity and reduced capacity.

SUMMARY OF THE INVENTION

The above and other objects hereinafter becoming evident have been attained in accordance with the present invention thru the discovery of stabilizing structure for throw adjusting eccentric cams such as are disclosed in the compressors described in the aforecited patents, particularly in the U.S. Pat. No. 4,479,419 patent, wherein the mechanism for positioning the cam at opposite end points comprises cooperating drive stop means on the crankshaft and driven dog means on the cam, wherein said stabilizing structure comprises at least one of (A) positive lock means selected from the group consisting of (a) latching means having cooperating elements on said crankshaft and cam, said elements being engageable and disengageable at least at one of said end points by the application of or the release of, respectively, centrifugal force applied to an element of said latching means, or (b) pressure differential operable means hating cooperating elements on said crankshaft and cam, said elements being engageable and disengageable by sudden and opposite angular motion respectively between said crankpin shaft and cam at least at one of said end points;

(B) friction drag means hating operating elements on said cam and said crankshaft and being engageable to resist destabilizing forces tending to rotate said cam on said crankpin shaft and thus separating said junction at least at one of said endpoints; or (C) pressure regulating means which functions to minimize any differential in pressure between the low side of the compressor and the compression chamber of a pacified cylinder.

It is noted that for certain compressor operating conditions it may not be considered necessary to provide a stabilizing structure for each of the junctions, i.e., at both of said endpoints, although providing at least one of said structures for each end point is highly preferred.

BRIEF DESCRIPTION OF THE DRAWINGS

The invention will be further understood from the drawings herein of certain preferred embodiments and the description thereof, wherein.

DETAILED DESCRIPTION OF THE DRAWINGS

Figure 1:
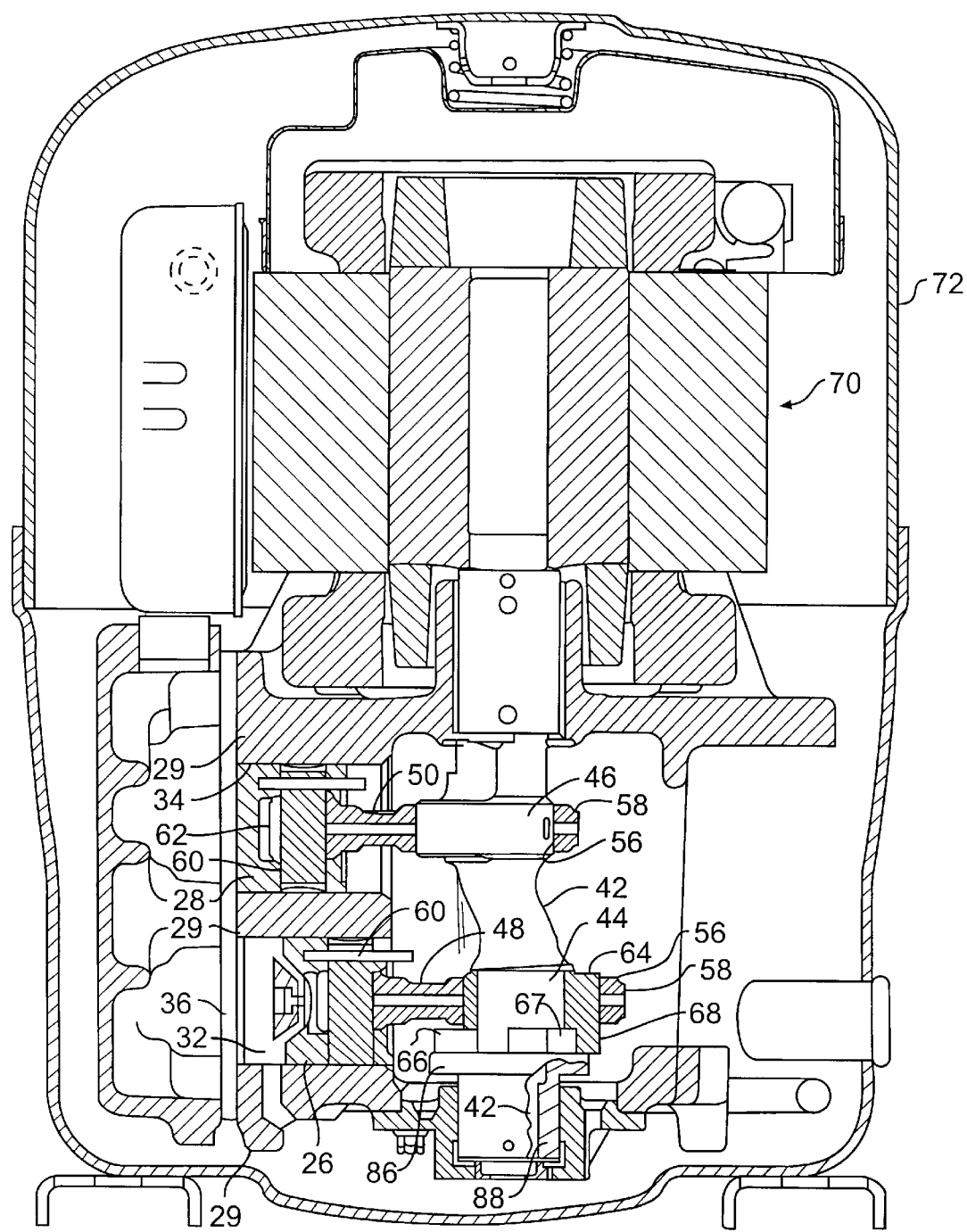
FIG. 1 is a longitudinal, vertical cross-sectional view of a refrigerant compressor with portions shove in relief for purposes of clarity and with its bottom crankpin throw modified with an eccentric cam in accordance with the present invention, with the cam shove in its active mode orientation, i.e., full throw of the crankpin, and with the associated piston hating a pressure deformable suction valve structure in the piston head, whereby said structure provides for pressure let-down from the compression chamber.
Figure 2:
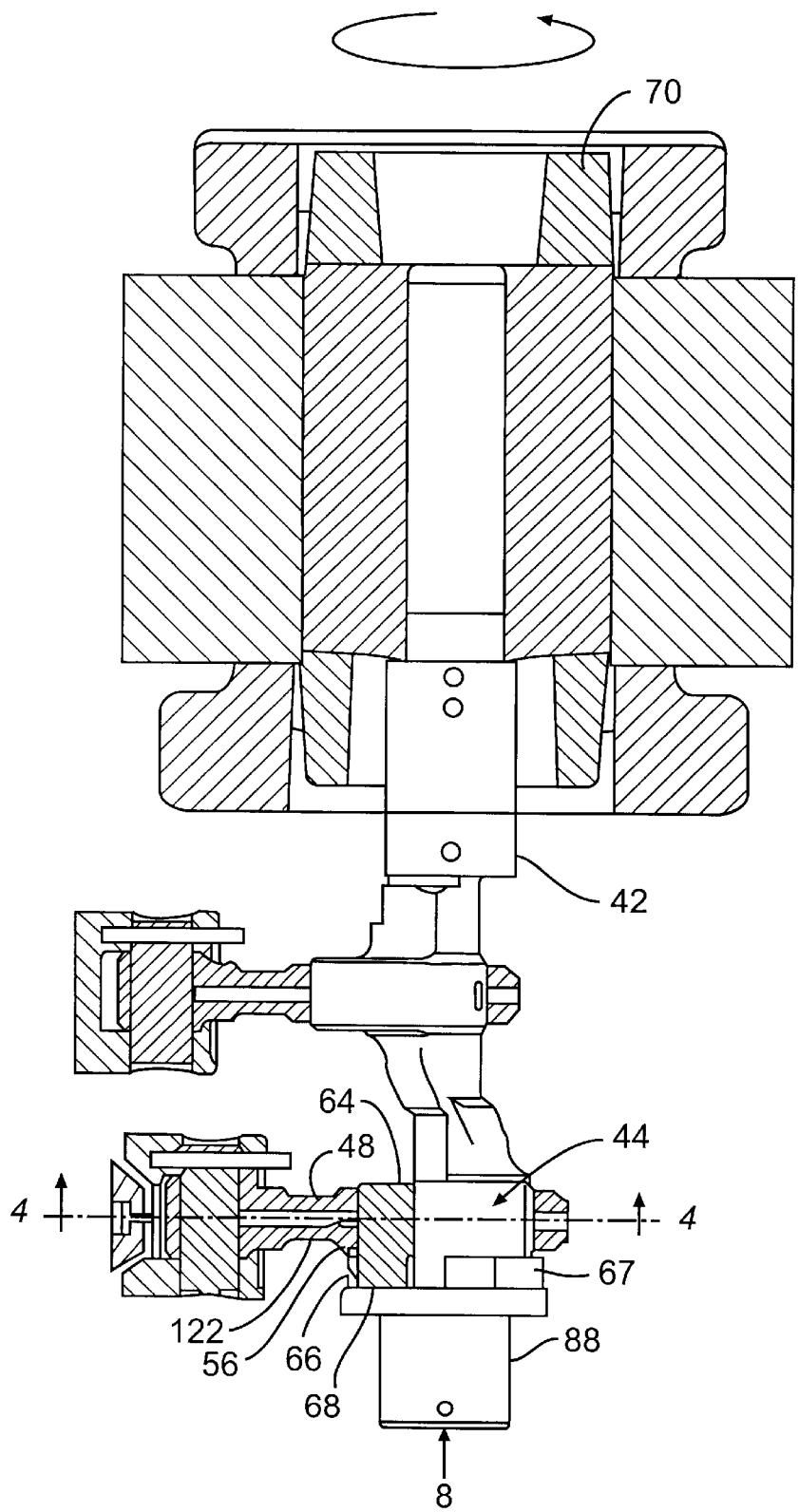
FIG. 2 is a cross-sectional view of the bottom piston and crankshaft throw area as in FIG. 1 and showing the cam in its passive mode orientation wherein the apex of the cam is proximal to its associated piston, i.e., producing a zero crankpin throw.

With reference to the drawings and the claims hereof, the present variable capacity gas compressor as shove in one particular embodiment as hating dual in-line pistons 26, 28 is comprised of cylinder block means 29 formed with cylinders 32, 34 in which pistons 26, 28 respectively are reciprocably mounted, and having a valve plate 36 in which suction valve means 38 and discharge valve means 40 typically are provided. It is noted however, that where the suction valve is mounted in the piston head as in U.S. Pat. Nos. 5,080,130; 5,106,278; and 5,203,857, the disclosures of which are hereby incorporated herein by reference in their entirety, no suction valve is needed in the valve plate.

A crankshaft 42 is rotatable mounted on said block means and is provided with crankpin shafts or eccentrics 44, 46. Connecting rods 48, 50 are each provided with a bearing 56 on one end portion 58, and with a wrist pin 60 on its other end portion 62. An eccentric cam 64 is rotatably mounted on at least one of said crankpins, and one of said bearings 56 is rotatably mounted on said cam. In one embodiment, as shown in FIG. 4 to drive stop 66 and 67 are provided on said crankshaft at predesigned angular positions thereon, and one driven dog 68 is provided on said cam at a predesigned angular position thereon.

It is noted that either two stops can be provided with one dog positioned therebetween, or two dogs can be provided with one stop positioned therebetween. Either way the stop(s) and dog,(s) define the angular limits or end points of rotatability of the cam on the crankpin.

A reversible motor 70 within the compressor shell 72 drives the crankshaft selectively in either rotational direction in accordance with operational electrical signals transmitted thereto, and the cam is responsively rotatable to one said end point upon rotation of said crankshaft in one direction and to the other end point upon rotation of said crankshaft in the reverse direction, at which end points the stop(s) and dog(s) form the junction(s).

Figure 4:
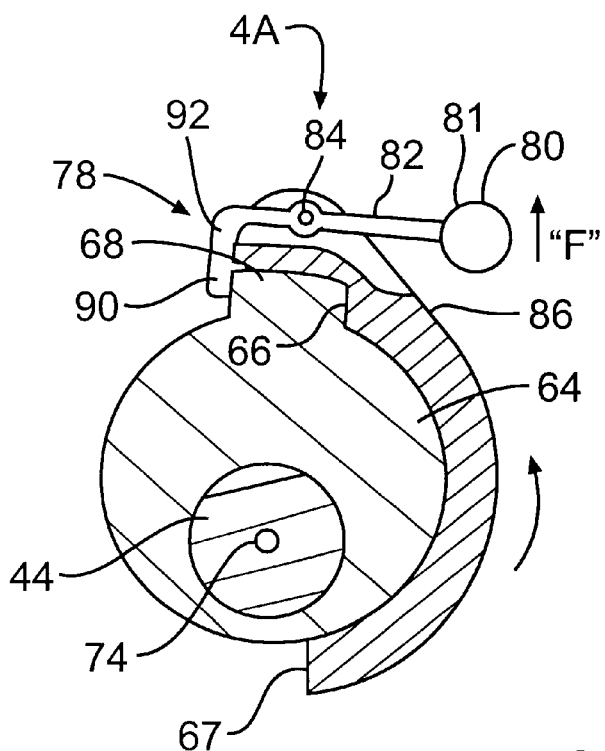
FIG. 4 is a cross-sectional view taken along line 4—4 of FIG. 2 showing a centrifugal force operable latching mechanism.
Figure 4A:
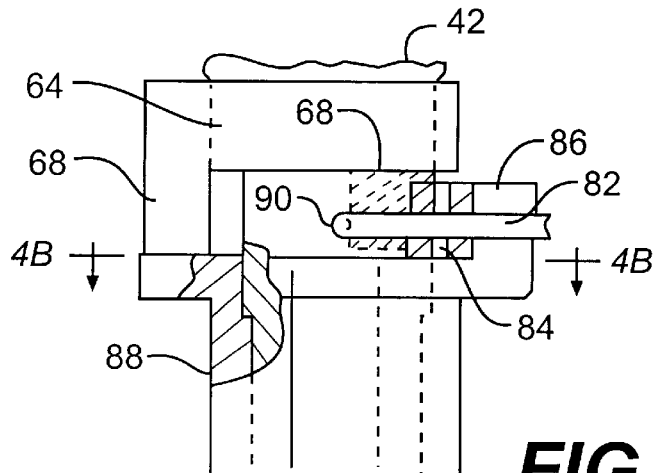
FIG. 4A is a view of the mechanism of FIG. 4 as viewed from the top side in the direction of line 4A.
Figure 5:
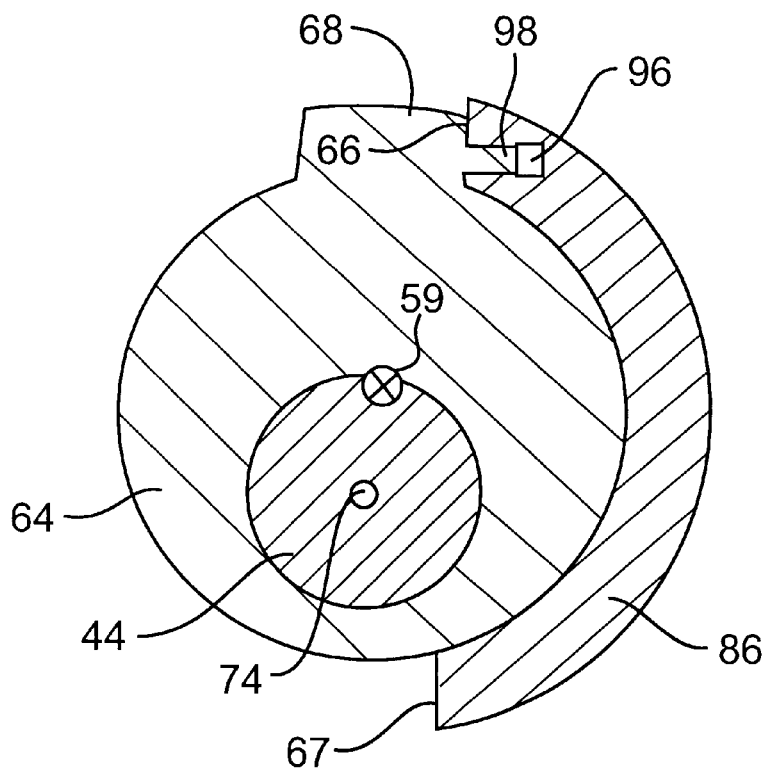
FIG. 5 is a cross-sectional view showing a pressure differential operated stabilizing structure.
Figure 6:
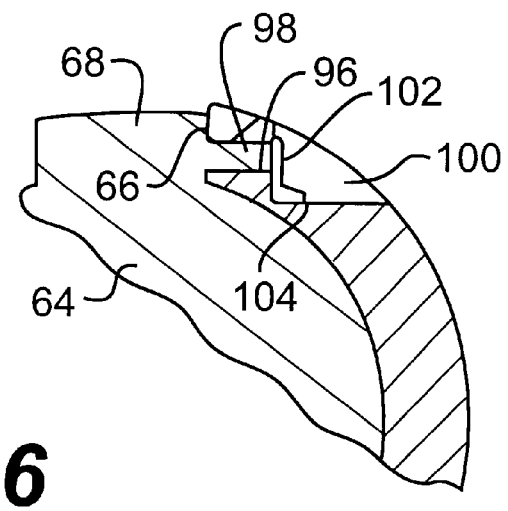
FIG. 6 is a view showing a variation of the structure of FIG. 5.

The present stabilizing means designated above as being at least one of (A) (B) or ((C) are further and more specifically explained with reference to the drawings wherein FIGS. 4–6 show exemplary embodiments of (A), FIGS. 7–11 show exemplary embodiments of (B), and FIGS. 12–21 show exemplary embodiments of((a).

Figure 3:
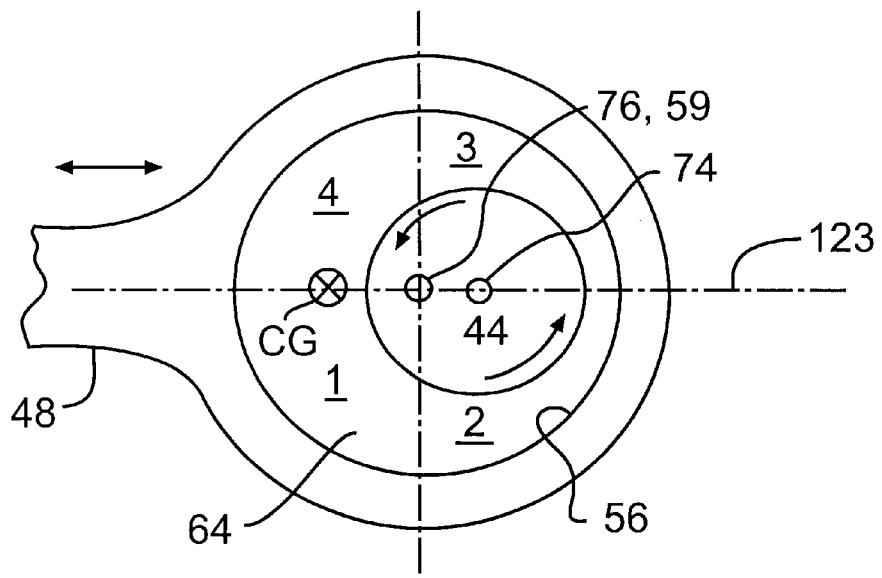
FIG. 3 is a geometric illustration of the passive throw cycle with reference to the structure of FIG. 2, taken in a counterclockwise crankshaft rotation in FIG. 2 as viewed from the bottom of the crankshaft along line 8, with the quadrants of the cycle numbered progressively 1–4 and with the piston at its passive position as in FIG. 2.

Referring to FIG. 3, the cam 64 is shown in its pacifying orientation wherein the center axis 74 of the crankpin shaft 44 has been translated to the rotational axis 76 of the crankshaft and the center or rotational axis 59 of the cam whereby the orbital axis of the crankpin has become aligned with the rotational axis of the crankshaft. This translation has, in effect, reconfigured the crankpin to be concentric with the crankshaft, the reformed crankpin now constituting the total mass and shape of the original crankpin shaft plus that of the cam. As seen in FIG. 3, each revolution or orbit of the crankpin is quartered into four quadrants 1–4, for purposes of clarity in regard to the aforementioned destabilizing forces and the stabilizing structures detailed below.

Figure 4B:
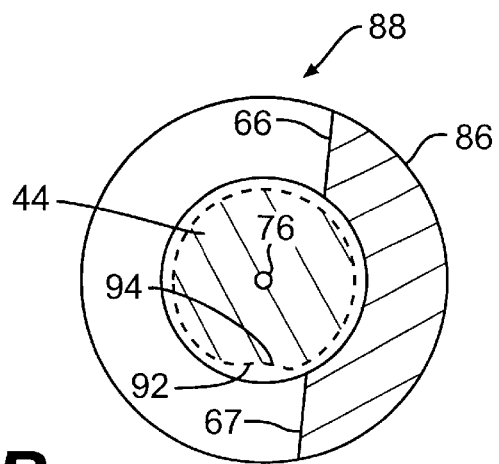
FIG. 4B is a view taken along line 4B—4B of FIG. 4A.

Referring to FIG. 4, 14A and 4B, a preferred structure for the latching means generally designated 78 comprises a mass 80, e.g., 5–10 ounces or so, on the distal end 81 of a lever 82 which is pivotally connected by a pivot in 84 to a portion of the crankshaft such as, e.g., skirt portion 86 of a bushing 88, which portion carries the dog or dogs. A hook member 90 is formed on the proximal end of the lever and engages the dog 68 as the dog engages stop 66, in response to upward centrifugal force "F" (as viewed in FIG. 4) on mass 80 developed by the rotating crankshaft.

It is noted that as the crankshaft slows down to reverse its rotation, the weight of mass 80 will overcome the centrifugal latching force "F" and pivot member 90 out of engagement with dog 68 to allow rotation of the cam to its other end point at stop 67. This delatching will occur most easily when the crankshaft, cam and lever structure as shown in FIG. 4 are in substantially their vertical orientation as shown in FIG. 4.

An identical device 78 may be mounted on the bushing skirt 86 adjacent stop 67 to maintain the dog 68 stop 67 junction in the same manner as described above. Bushing 88 is keyed to the crankshaft by cooperating flats 92 and 94 on the crankshaft and the bushing 88 respectively. Keys and keyways may of course be employed alternatively for this purpose.

Figure 4C:
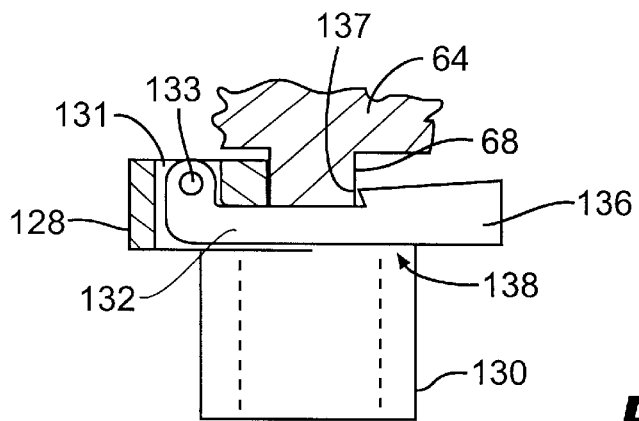
FIG. 4C is a side view of a preferred construction and configuration of the type of stabilizing means of FIG. 4 in its latching or running mode.
Figure 4D:
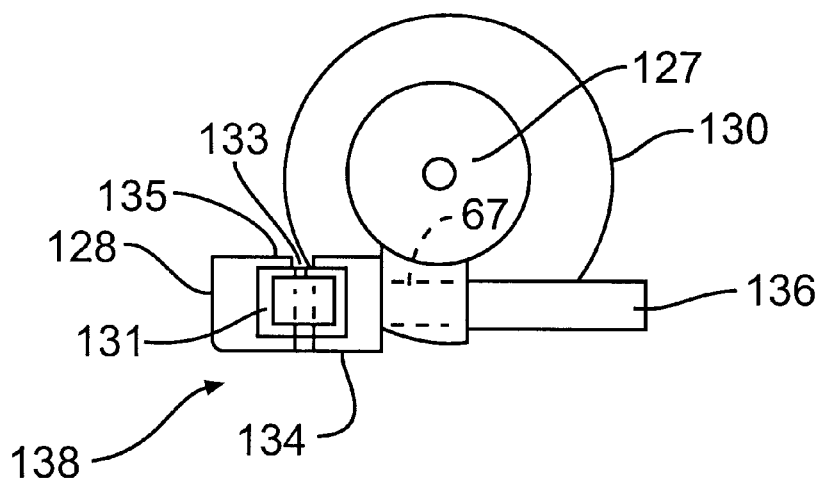
FIG. 4D is a top view of the stabilizing means of FIG. 4C.
Figure 4E:
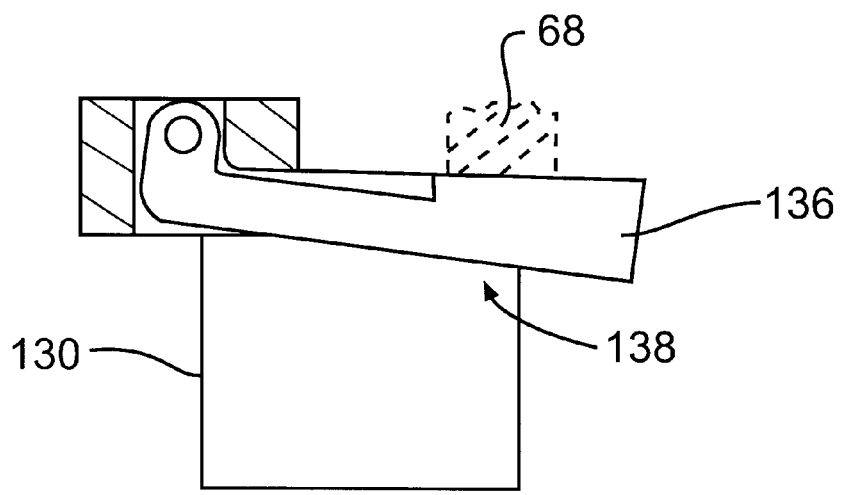
FIG. 4E is a side view of the stabilizing means of FIG. 4C in its unlatched or stopped mode.
Figure 25:
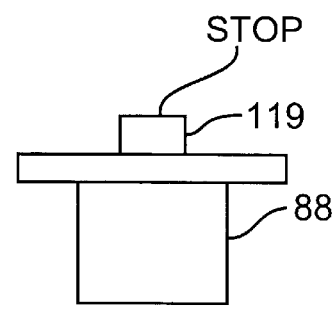
FIG. 25 is a side view of a single dog bushing for use with the cam of FIG. 22.
Figure 26:
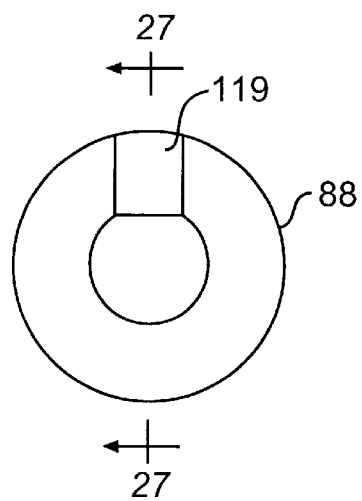
FIG. 26 is a top view of the bushing of FIG. 25.
Figure 27:
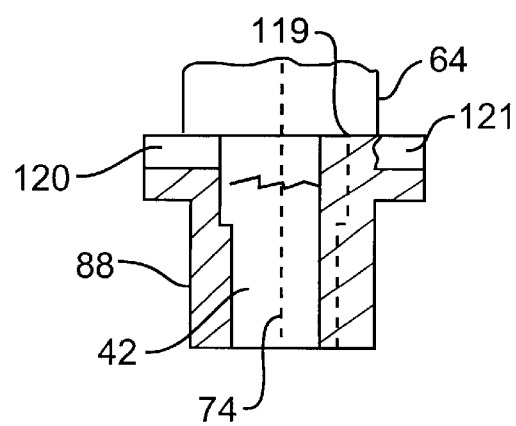
FIG. 27 is a partially cross-sectioned view taken along line 27—27 of FIG. 26, an assembly of the cam of FIG. 22 and the bushing of FIG. 25 onto the lower end of the crankshaft.

Referring to FIGS. 4C, 4D and 4E, the modification of bushing 88 as shown as 130 in FIGS. 4C–4E is rotated 180° on its bore axis 127 from 88 of FIGS. 25–27, and is provided at its upper end with a stabilizing means 138 comprising a boss generally designated 138 hating a channel opening 131 in which a latching arm 132 is pivotally mounted on a pivotal axis pin 133 affixed thru the sides 134, 135 of the boss. Arm 132 extends generally laterally of the bushing and is formed with a mass 136. A shoulder 137 is provided on the arm for engaging a dog such as 68 shown in FIG. 4 when the crankshaft is rotated and the centrifugal force thus produced moves arm 132 upwardly from its non-latching position of FIG. 4E. In this embodiment, another such stabilizing means 138 may be provided on the opposite top portion of the bushing to also stabilize the junction(s) at that end point.

Referring to FIG. 5 the stabilizing structure comprises a close mating cavity 96 and plunger 98. During compressor operation, cavity 96 is typically flooded with compressor oil, and when the dog-stop junction is formed, an oil seal exists around plunger 98. Thus when a destabilizing force acts on the cam tending to pull the plunger from the cavity, a pressure differential is developed across the plunger tending to force it back into the cavity. When, however, motor reversal occurs, the initial inertia of the cam and the acceleration of the crankshaft suffice to pull the plunger from the cavity and disrupt the junction.

Referring to FIG. 6, the stabilizing structure of FIG. 5 may be modified by opening the inner end of cavity 96 to ambient crankcase conditions by cut-out 100 and by affixing a check valve such as the thin, highly flexible flap valve 102 to the skirt by pin 104 or the like. This valve which is flexibly biased toward its closed position allows plunger 98 to easily insert into cavity 96 during the junction making by springing open in response to small hydraulic force, but when closed maintains said pressure differential and presents inopportune withdrawal of the plunger.

Figure 7:
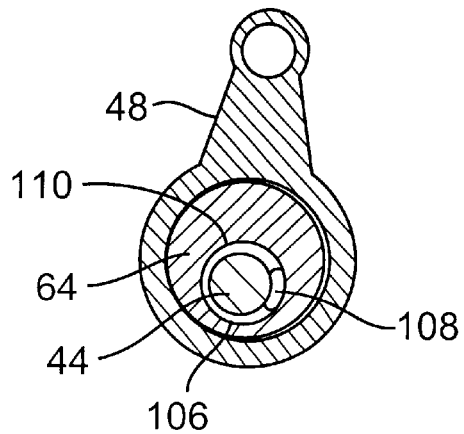
FIG. 7 is a cross-sectional view taken along line 4—4 of FIG. 2 and shoaling the crankpin journal surface provided faith a groove and O-ring in sliding contact with the cam bearing surface.

In FIG. 7, the stabilizing structure comprises an O-ring 106 secured in an annular groove 108 in the crankpin shaft journal surface and frictionally engaging the bearing surface 110 of the cam. This O-ring can be dimensioned with respect to the journal and cam to provide a drag which cannot be readily overcome by most of the destabilizing forces.

Figure 8:
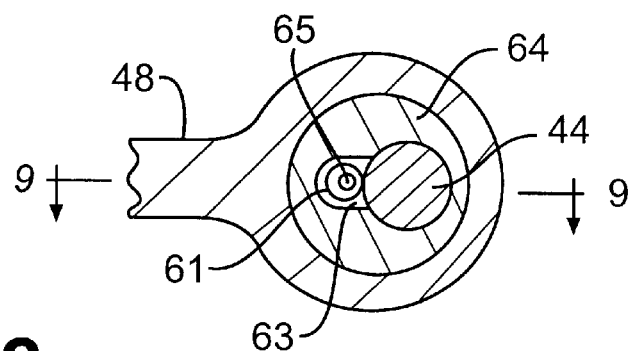
FIG. 8 is a cross-sectional view of the bearing-journal area taken along line 4—4 of FIG. 2 in the direction of the arrows and showing a mechanical means, i.e., a pressure roller for developing friction drag and tending to maintain said junction(s)
Figure 9:
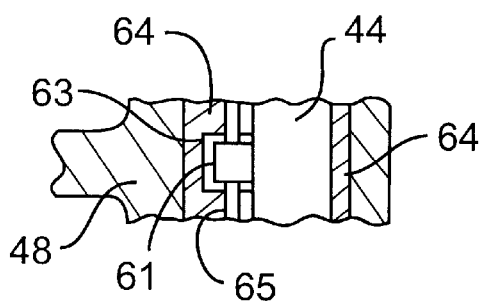
FIG. 9 is a cross-sectional view taken along line 9—9 of FIG. 8 further showing the mountings for the roller of FIG. 13.

Referring to FIGS. 8 and 9, the frictional drag is provided by a roller 61, preferably of semi-hard plastic such as Nylon, Teflon, or the like, rotatably mounted in a recess 63 formed in the body of cam 64, by shaft 65. This roller also may be dimensioned to provide practically any desired stabilizing force.

Figure 10:
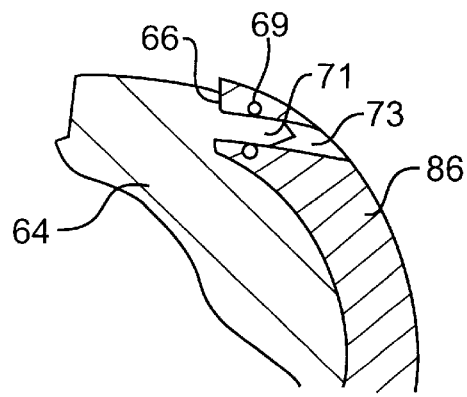
FIG. 10 is a view as in FIG. 5 showing a friction drag, stabilizing structure.

In FIG. 10 a variation of the pressure differential stabilizing structure of FIG. 5 is shown, and provides a desired friction drag by means of an O-ring 69 frictionally surrounding a plunger 71 in a thru bore 73 provided in skirt 86.

Figure 11:
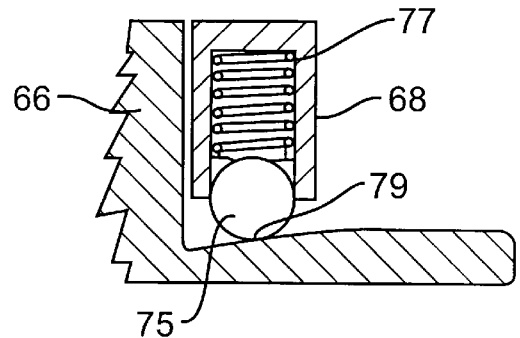
FIG. 11 is a variation of the friction drag means.

In FIG. 11 the frictional drag is provided by means of a ball 75 and compression spring 77 mounted in dog 68 and wherein a ramp 79 is provided on the crankshaft adjacent the stop. As the junction is made, the ball is cammed or forced down the ramp 79 towards the stop by the action of the ramp and spring. This camming force maintains the junction against at least some of the destabilizing forces.

It is particularly noted that all of the embodiments of the stabilizing structure of FIGS. 4–11 can also be employed to stabilize the junction at stop 67. Also, should it be desirable for a particular compressor, the stops 66, 67 may be angularly displaced at more or less than the approximate 180° as shown since these stabilizing structures are operable for any angular displacement.

Referring to FIGS. 12–22, these stabilizing structures are designated to help regulate the pressures in the compression chambers of active cylinders as well as in completely pacified or partially pacified cylinders.

Figure 12:
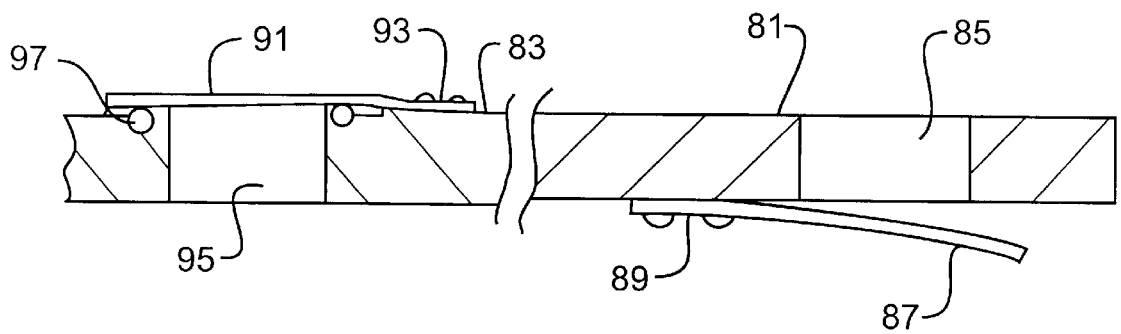
FIG. 12 is a cross-sectional view of a portion of the valve plate of FIG. 1 shorting a sprung reed-type suction valve and special discharge valve.

In FIG. 12 is shown a Goalie plate hating a suction section 81 and a discharge section 83. In the suction section hating suction port 85, a reed-type suction valve 87 is shown affixed at one end 89 to the plate in known manner. This valve is lightly sprung, to an open position as shown, whereby when the piston is in a completely pacified condition, any high pressure refrigerant leakage past the discharge valve into the compression chamber which could present a destabilizing force will be let down into the low pressure section of the compressor thru the suction valve. This suction valve is sprung open with only a light force, e.g., 5–10 ounces, such that it will close readily upon reactivation of the cylinder.

In FIG. 12, a discharge valve 91 is affixed to the plate at one end 93 and functions to seal and open discharge port 95. This particular discharge valve is designed to be essentially non-leaking by virtue of an O-ring 97 mounted in an annular groove formed in the valve plate and surrounding the discharge port. Such a valve greatly assists in diminishing the development of incidental pressure in the compression chamber of a completely pacified cylinder.

Figure 13:
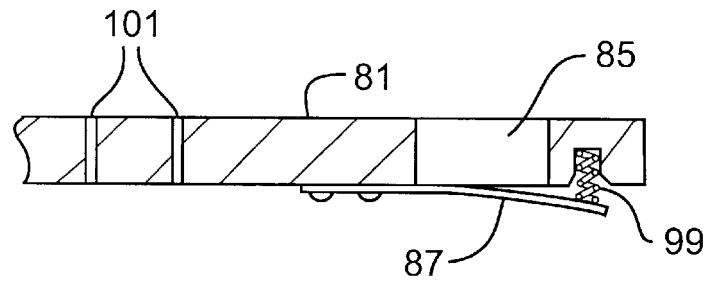
FIG. 13 is a view as in FIG. 12 showing the use of a positive pressure applicator means for resiliently urging a normally closed reed valve to a slightly open position and showing pressure let down apertures thru the suction of the valve plate.

In FIG. 13, the valve 87 is shown biased to an open position by means of a very light compression spring 99 mounted in the plate. Also shown in this figure are alternative or complementary stabilizing, means, particularly for a pacified cylinder, of one or more small bleed apertures 101, e.g., 10–20 microns in diameter, formed in the suction section of the valve plate and communicating with the low side of the compressor.

Figure 14:
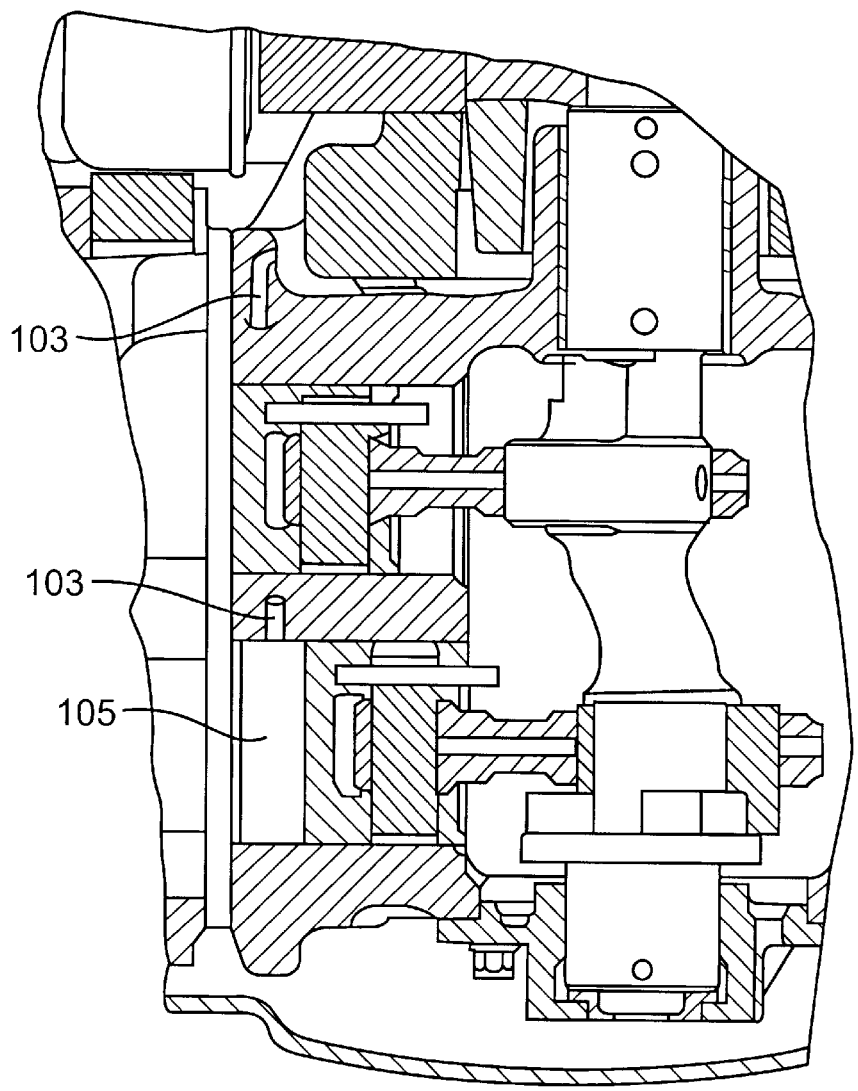
FIG. 14 is a view as in FIG. 1 of a portion of the compressor showing a pressure let-don aperture formed thru the cylinder wall and communicating thru conduit means provided in the cylinder block with the low pressure side of the compressor at a location removed from the dense gas-oil area of the crankcase.

In FIG. 14, a pressure let-down conduit or passage 103 is provided either externally of the block or formed internally therethrough as indicated, which communicates with the compression chamber 105 and extends upwardly to an outlet communicating with the low side at a position removed from the heady oil-refrigerant mix.

Figure 15:
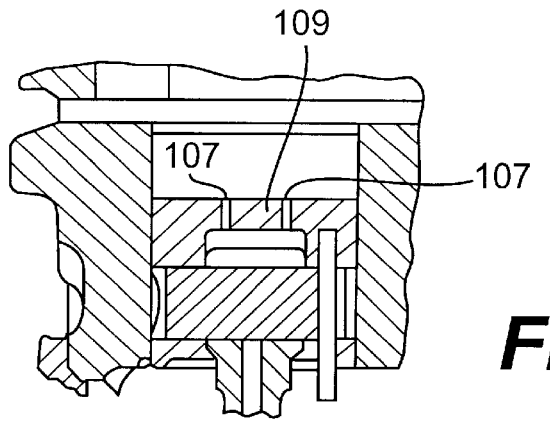
FIG. 15 is a cross-sectional of a switchable piston having one or more small diameter pressure let-down holes thru its top.

In FIG. 15 one or more small bleed apertures 107, identical, e.g., to 101 are formed thru the top or head 109 of the piston and communicate with the low side.

Figure 16:
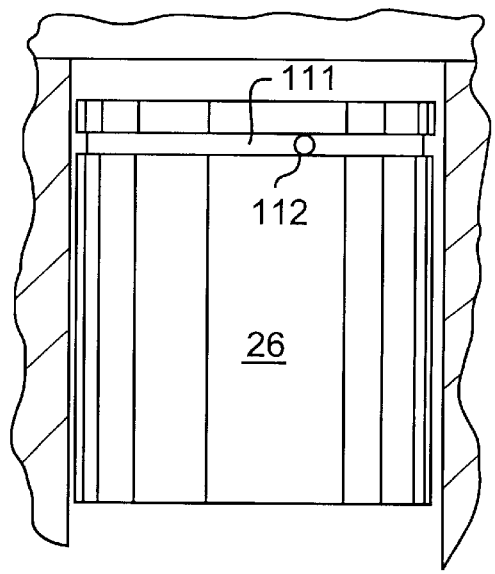
FIG. 16 is a cross-sectional view of a crankcase portion with a modified piston shown in relief.

In FIG. 16, the piston 26 is provided with an annular oil groove 111 which communicates thru an oil feed hole 112 which connects into the oil channels or passages of the crankshaft and connecting rod which feed the bearings and wrist pins thru a conventional pumping action. During active piston operation the pumping action feeds groove 111 under pressure and the oil forms a seal between the piston and the cylinder wall which substantially prevents the flow of high pressure refrigerant to the low side. When the piston is passive however, the gap 113 between the piston and cylinder wall is not sealed and thus allows any incidental pressure in the compression chamber to let down to the low side.

Figure 17:
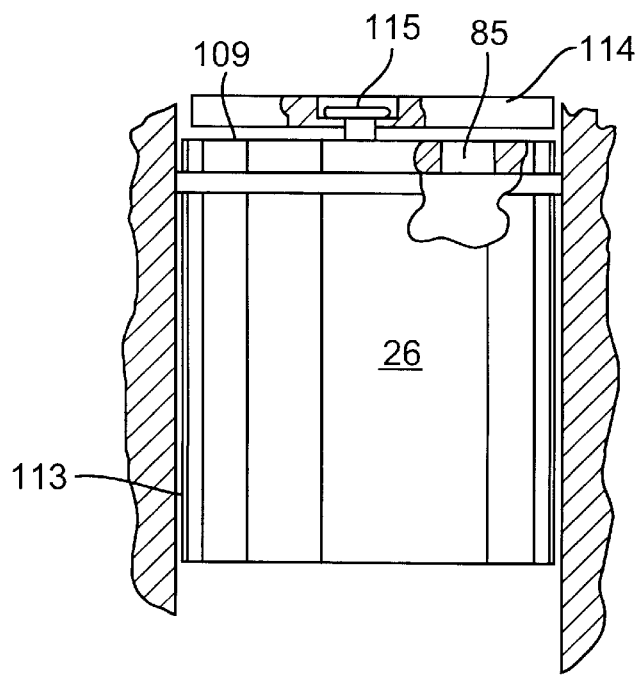
FIG. 17 is a view as in FIG. 6, with portions broken away and showing a piston having a floating suction valve.

In FIG. 17, the pressure let down is achieved by employing a suction valve which has an essentially free-floating disc 114 which is loosely held on the piston head by a retainer member such as 115. This disc is shown in its wide open position such as would exist on a normal suction stroke whereby suction port 116 which is in communication with the low side suction gas is side open. In a passive condition of the cylinder when the suction disc is simply lying on the top 109 of the piston without experiencing any significant sealing gas pressure, the disc and valve port in the piston head do not form a good gas seal, and any incidental pressure forming in the compression chamber can readily let down past this disc into the low side. A working example of this embodiment is given below.

Figure 18:
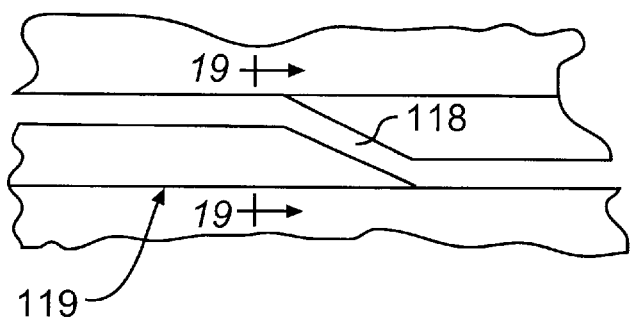
FIG. 18 is a side view of a portion of a piston showing a special sprung compression ring and groove construction in a leaking suction mode.
Figure 19:
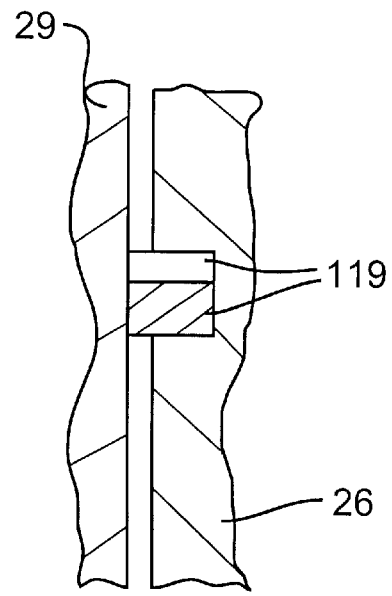
FIG. 19 is a cross-sectional view taken along line 19—19 of FIG. 18.
Figure 20:
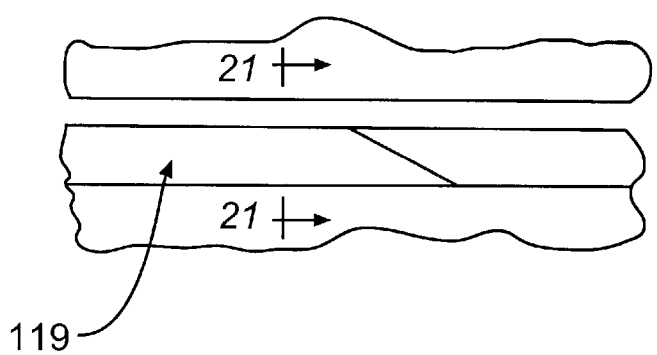
FIG. 20 is a view as in FIG. 18 showing the ring in a sealing compression mode.
Figure 21:
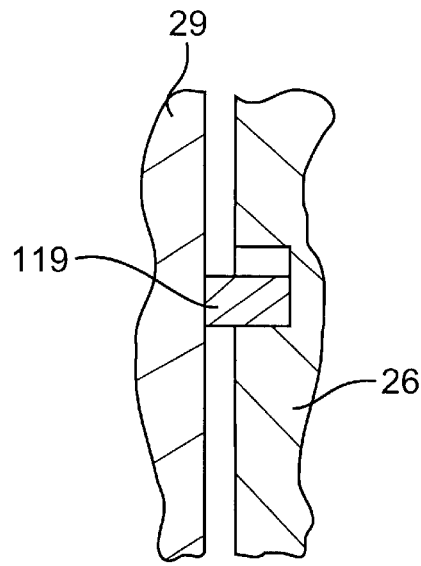
FIG. 21 is a cross-sectional views taken along line 21—21 of FIG. 20.

Referring to FIGS. 18–21, the incidental pressure let down is thru the gap 118 formed between the ends of a twisted or cocked piston ring 119. The ring in its unpressured and leaking condition is as shown in FIGS. 18 and 19, and in its pressured and sealing condition, as on a normal compression stroke, is as shown in FIGS. 20 and 21.

Figure 24:
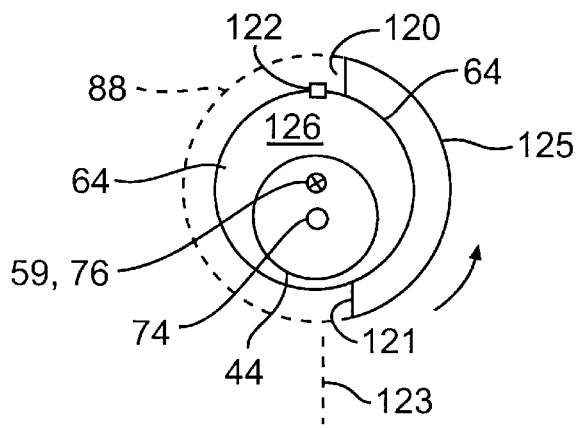
FIG. 24 is a top view of the cam of FIG. 22.

A most preferred embodiment of the cam dog and crankshaft stop construction are shown in FIGS. 22–27 wherein in FIG. 24 the crankshaft is rotating counterclockwise and the cam is in its pacifying position. In this embodiment, the bushing 88 carries a single stop 119 and the cam 64 carries a pair of dogs 120 and 121, and wherein the dog and stops are positioned such that the apex 122 of the cam will lie substantially in the orbital plane 123 of the crankpin at each dog or end point 120 and 121 of the cam rotation. It is noted that orbital plane 123 is defined by the crankpin shaft center axis 74 and the rotational axis 76 of the crankshaft. This construction provides for selected full or zero piston stroke.

Figure 28:
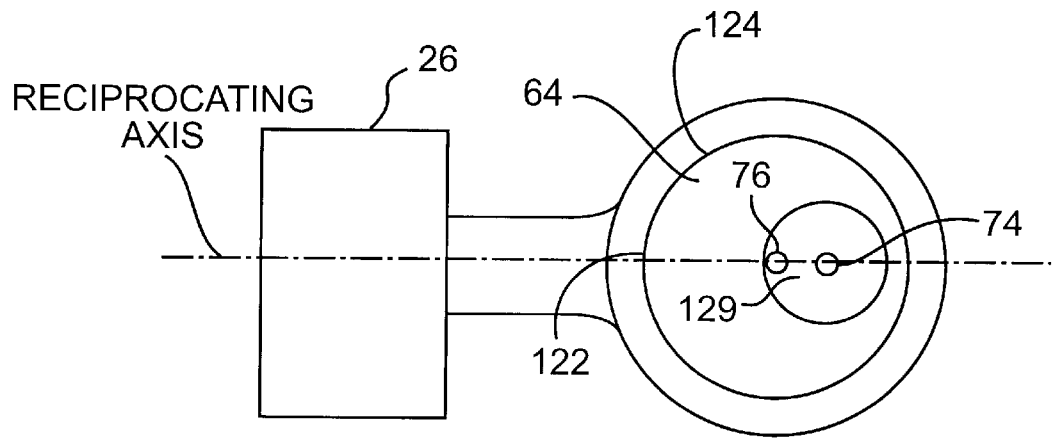
FIG. 28 is a further explanatory view of a pacified piston.
Figure 29:
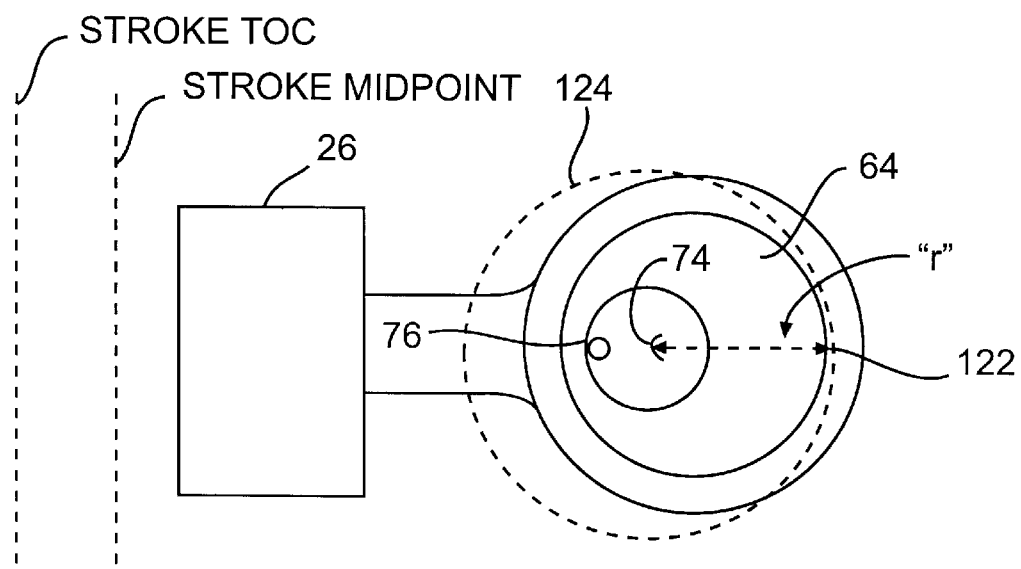
FIG. 29 is a further explanation view of the piston of FIG. 28 in a fully active, i.e., full stroke mode.

The relative angular orientations of the crankpin, cam and crankshaft at the two end points are given in FIGS. 28 and 29 wherein the cam is dimensioned such that in its proximal or pacifying orientation of FIG. 28 the orbit 124 of the crankpin (i.e., crankpin shaft 129+cam 64) is concentric with the crankshaft axis 76. Conversely, in the fully operational orientation of the cam as in FIG. 29 the orbit 124 of the crankpin is at its maximum radius "r".

In this embodiment the stabilizing structure comprises a mass 125 added to the cam body 126, wherein the stops 120 and 121 or end points are provided on the mass. This added mass shifts the center of gravity (CG) of the cam as shown, e.g., in FIG. 3 from its approximate position as shown therein to the approximate new position shown in FIG. 22. This new CG position which is offset, i.e., in advance of, the aforesaid orbital plane 123 which passes thru the crankshaft axis and the crankpin axis will generate a CFT tending to maintain the junction(s) against the aforementioned destabilizing forces. This modified cam structure, thru proper design of its configuration and weight distribution, can be tuned to produce any desired CFT, e.g., from about 10 to about 50 in lbs at a conventional crankshaft rotational speed of 3600 rpm. Such a CFT will substantially, if not totally, offset the destabilizing forces generated during active piston reciprocation.

The above weighted cam can be effective by itself to diminish a substantial portion of the destabilizing forces for many compressor constructions and operating parameters. However, it has been found that in situations where a zero piston stroke mode is attempted, some additional stabilizing means is necessary, particularly in view of the space limitations imposed upon the structure and the allowable dimensions of the crankpin and connecting rod bearing, and upon the allowable dimensions of the connecting rod oscillations, by the structural confines of the compressor crankcase.

Thus, one or a combination of the stabilizing structures of the present invention as defined above and further below can be used very effectively, particularly in combination with the above described weighted cam to provide a substantially comprehensive stabilizing structure.

The present invention includes the method of stabilizing a compressor throw adjusting cam of a compressor having a complex crankpin journal, against destabilizing forces, wherein said cam forms part of said journal and is angularly adjustable about the shaft of said crankpin between angularly spaced end points which are delineated and established as junction(s) by structural stop and dog means on the crankshaft and cam respectively, and wherein said destabilizing forces comprise refrigerant pressure differentials and mechanical inertial forces acting on the piston associated with said crankpin throw, said method comprising counteracting said destabilizing forces by a combination of centrifugal force torque forces generated by said cam and tending to maintain said junction(s), and by pressure let down means tending to reduce said pressure differentials.

The Examples I and II below sill further illustrate preferred embodiments of the present invention.

EXAMPLE I

Figure 22:
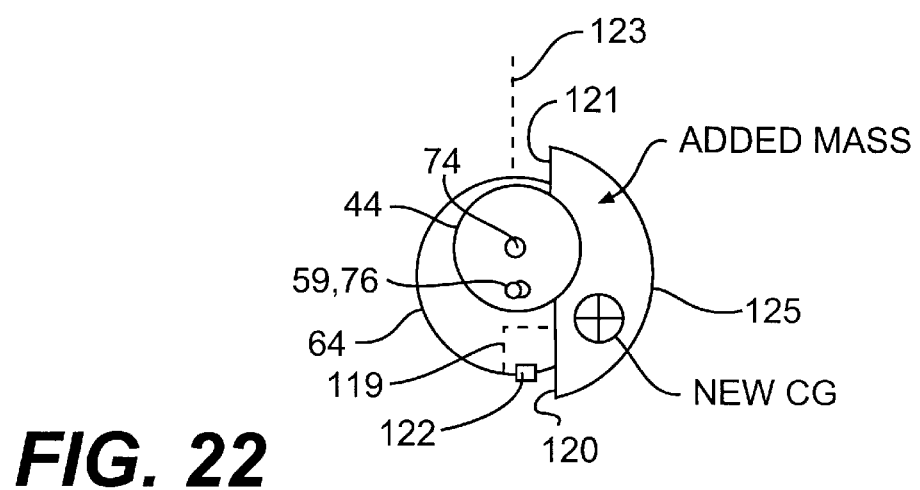
FIG. 22 is a bottom view of a preferred weighted, double stop cam for developing CFT for stabilizing the junction(s)
Figure 23:
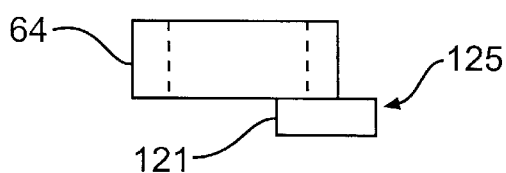
FIG. 23 is a side view of the cam of FIG. 22 rotated 90° thru the plane of the drawing paper.

A preferred embodiment of the stabilizing means or structure of the present invention, as best known at this time, and typical, but by no means limiting, structural, dimensional, and operating parameters therefor is given below as a best mode example in the context of a dual piston refrigeration compressor of about 40,000 Btu/hr capacity. The compressor has a volumetric capacity shiftable cylinder #1 and non-variable volumetric capacity cylinder #2, wherein the crankpin throw of cylinder #1 is shiftable from a zero piston stroke position to a full piston stroke position, and vice-versa. In this example, the stabilizing structure comprises a free-floating suction valve disc of the general types shown, e.g., in FIGS. 17 and 32–34, and in the aforementioned U.S. Pat. Nos.: 5,080,130; 5,106,278; and 5,203,857, in combination with a CFT generated by the weighted cam as shown in FIG. 22. The weight of the valve disc in this example is negligible and does not factor into the calculation of the Coefficient-Of-Leakage (COL). Also, this COL is independent of the areas and configurations of the actual contact or sealing surfaces between the disc and suction port, as well as the materials of construction of said surfaces and represents an extremely-coherent design tool.

(1) maximum volumetric capacity of shiftable cylinder #1—(3.5 in$^3$);

(2) non-variable volumetric capacity of cylinder #2–(3.5 in$^3$);

(3) normal operating pressure range in shiftable cylinder #1 in its fully active mode—(77 to +297 Psig);

(4) normal operating pressure range in cylinder #2 in its fully active mode—(77 to 297 Psig);

(5) experienced pressure range in shiftable cylinder #1 during normal compressor operation of piston #2, and with piston #1 in its substantially fully passive mode, i.e., wherein the #1 piston moves less than about 10% in either direction beyond the mid-point of its fully active stroke—(0 to 40 Psig)

(6) COL* (0.2, preferably ranging from about 0.03 to about 0.5 and most preferably from about 0.5 to about 0.35);

(7) CFT generated by cam at crankshaft speed of 3600 rpm—(10.0 in lb to about 20.0 in lb)

(8) maximum crankpin throw radius for piston #1—0.550 in;

(9) maximum crankpin throw radius for piston #2—0.550 in;

(10) top surface of suction valve disc—about 2.0 to 2.5 in$^2$;

*This coefficient is the ratio of the sealing pressure on the suction valve disc structure to the refrigerant leakage flow rate thru the suction valve, wherein said sealing pressure is equal to the total pressure on the compression side, i.e., the entire top surface of the valve disc, in lb, and wherein the leakage flow rate is in in$^3$ per minute of refrigerant leaking past the substantially closed or semi-closed suction valve at a constant pressure differential across the suction valve, i.e., between the idle compression chamber and the low side, of 20 Psig at a temperature of 20° C. This coefficient, in terms of its units would be, $$COL = \frac{\text{lb} \cdot \text{min}}{\text{in}^3}.$$

Figure 37:
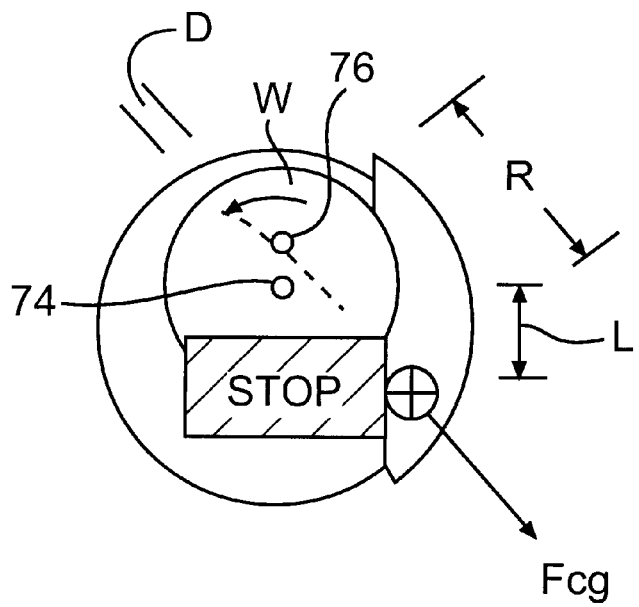
FIG. 37 is a view similar to FIG. 22 and showing how the desired CFT is calculated for a fully active piston.
Figure 38:
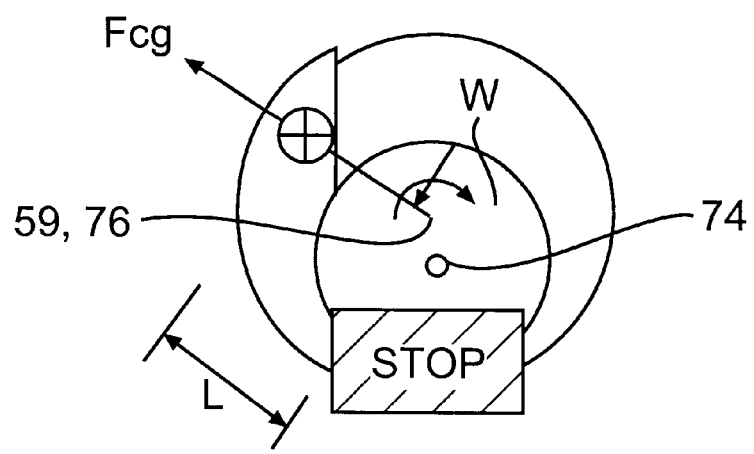
FIG. 38 is a view similar to FIG. 37 but showing the cam in its pacifying orientation, and the calculation for the desired CFT.

Centrifugal Force Torque (CFT) Calculation—See FIGS. 37 & 38 m=mass of cam=0.3 lb-in.

W=rotational velocity of crankshaft.=3600 rpm=377 radians/second (there are 2 pi radians per revolution of the crankshaft).

R=distance between the rotational axis of the crankshaft and the cam center of gravity=0.500 in.

$$gc = \text{gravity constant} = 386.4 \frac{\text{lb} \cdot \text{min}}{\text{lbf} \cdot \text{sec}^2},$$

wherein lbm=pound mass and lbf=pound force.

Force (Fcg) acting on cg (center of gravity) of cam due to $$\text{rotation} = Fcg = \frac{mw^2 R}{gc} = \frac{0.3(377)^2(0.5)}{386.4} = 55.18 \text{ lbf}$$

Fcg.D=Resulting centrifugal force to (CFT) around center torque crankpin shaft.

D=perpendicular distance between the center axis 74 of the crankpin shaft and the Fcg line of action, i.e., the line passing thru the rotational axis of the crankshaft and the cg of the cam.

*CFT*=55.18 *lbf* (0.1220 *in*)=6.90 *in.lbf*

$$\text{Contact force between stop and dog} = F_s = \frac{CFT}{L}$$

L=distance from center axis 74 of crankpin shaft to center of contact between the dog and stop=0.500 in $$Fs = \frac{6.90}{0.50} = 13.8 \text{ lbf}$$

Figure 30:
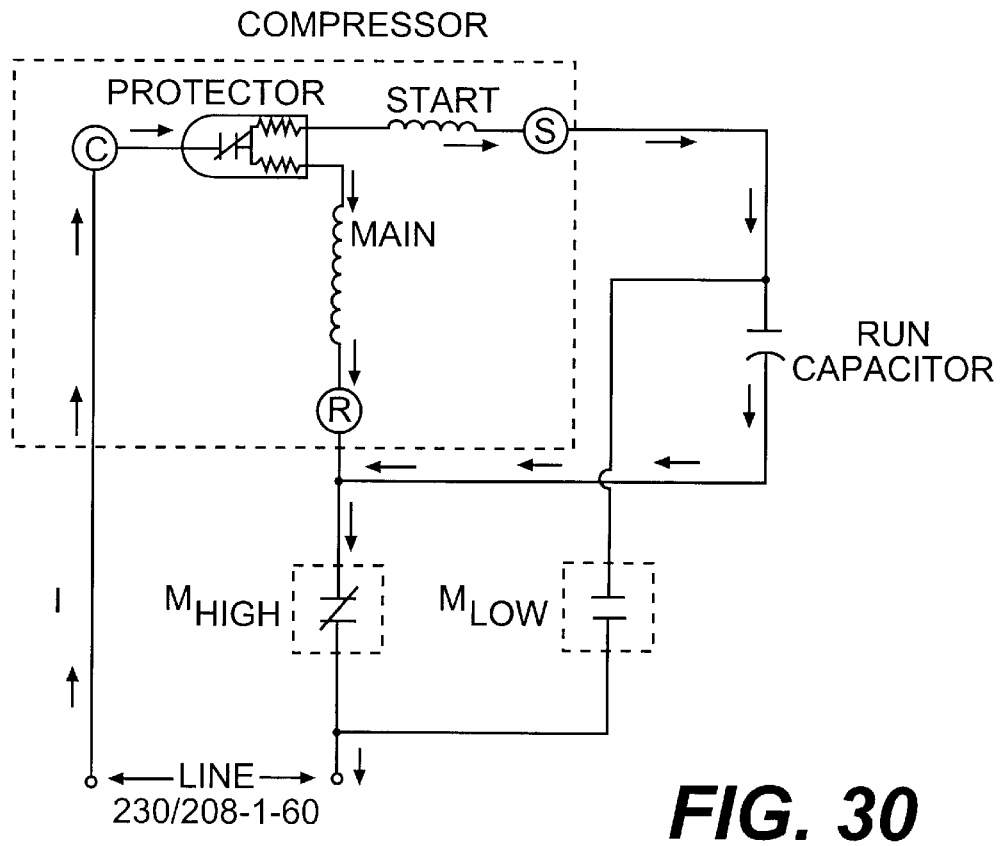
FIG. 30 is an electrical schematic of a preferred motor circuit for two piston full operations.

As mentioned above, a unique electrical circuit has been developed for controlling the reversible motor and may be employed in the preferred embodiment of the invention as described in Example I below, the circuit being shown schematically in FIGS. 30 and 31.

The TS, i.e., "twin-single" connotation, meaning two or one piston operation. The Control Schematic of FIG. 30 is equivalent to industry conventional PSC (permanent, split capacitor) wiring schematics using predetermined power supply. Line I runs through the common terminal (C) which leads into the motor protection. After leasing the motor protection the current flow will split, going through both the Start (S) and Main, i.e., Run (R) windings with M (motor) High contactor closed. This stage will be using the Run winding as the Main winding and places the Run capacitor in series with the Start winding, obtaining standard motor rotation with two pistons fully active.

Figure 31:
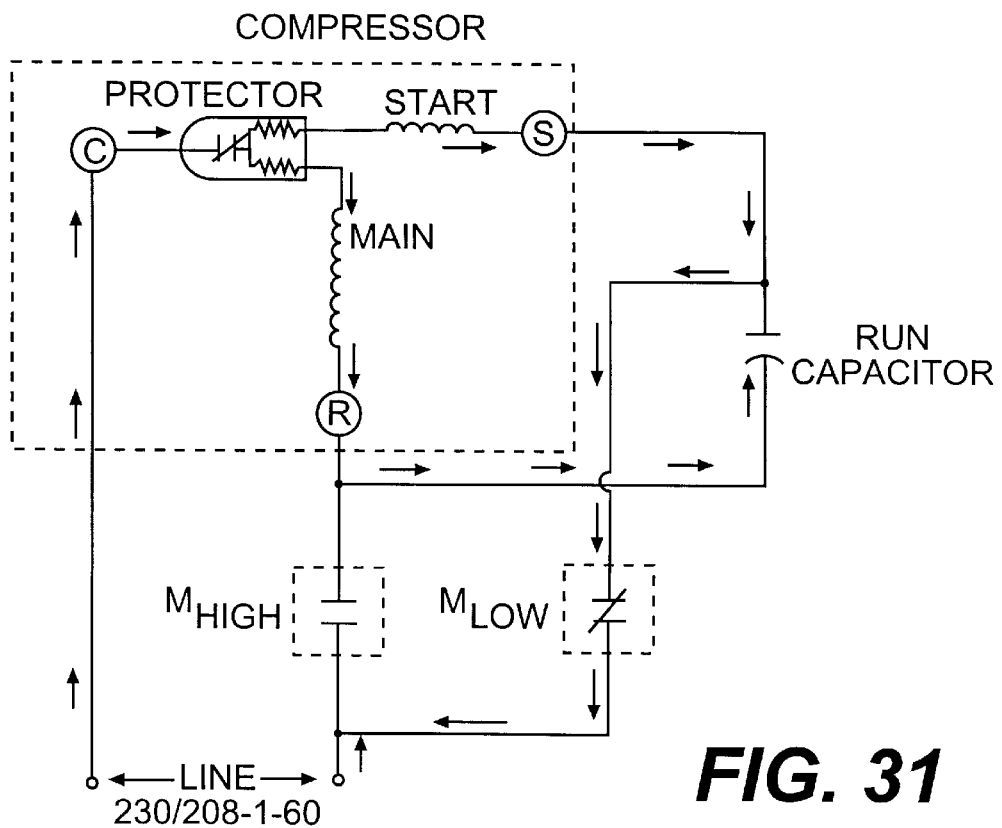
FIG. 31 is an electrical schematic of the circuit of FIG. 30 for one piston full operation.

The present unique TS Control Schematic of FIG. 31 employs a predetermined power supply depending on application. Line one will run through the common terminal ((C), which leads to the motor protection. After leasing the motor protection, the current flow separates going through both the Start and Main Endings with M low contactor energized. The TS will non be using the Start winding as the lain and placing the Run capacitor in series With the original Main winding. Run capacitor placement in this mode facilitates both motor and mechanical rotation changes and simultaneously reduces motor strength to match the resulting reduced or eliminated piston stroke, thus maximizing motor efficiency for the reduced load.

EXAMPLE II

This example of the present unique circuit, as best known at this time for use with the compressor of Example I, employs the following structures and operating parameters Motor (reversible) 3–4 hp.

Protector—Protects against overload in both load modes. Senses both T° and current.

Power Supply—Single or three phase of any frequency or voltage, e.g., 230V- 60 $H_z$ single phase, or 460 - 60 $H_z$ three phase.

Switching Mechanism—control circuit which is responsive to load requirements to place the Run (capacitor in series with either the Start winding or Main winding, depending on the load requirements.

Figure 32:
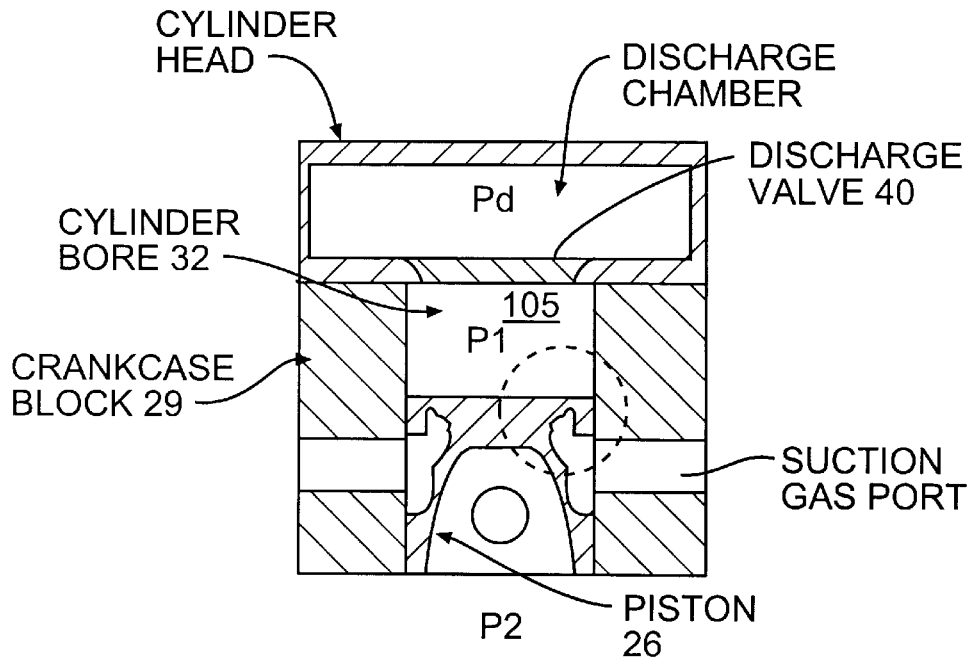
FIG. 32 is a cross-sectional view of a cylinder, piston and head structure illustrating the configuration of the pressure let down suction valve disc on FIGS. 1 and 2 on the compression stroke.
Figure 33:
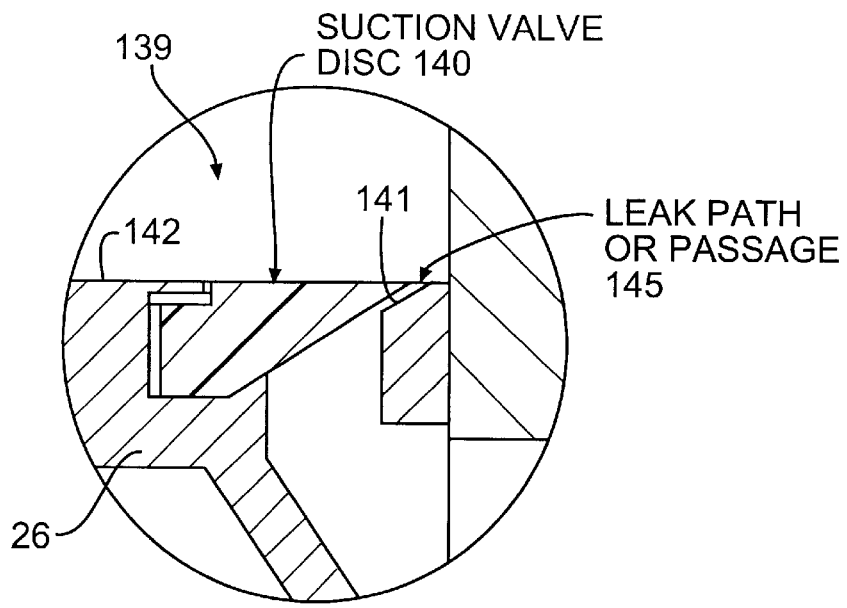
FIG. 33 is an enlarged view of the encircled portion of the suction valve of FIG. 32 illustrating the configuration of said vale disc during pacified cylinder operation.
Figure 34:
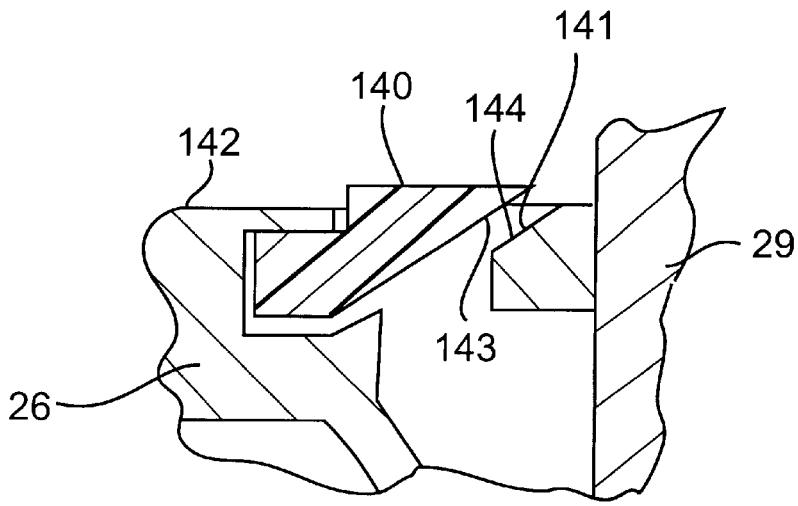
FIG. 34 is a view as in FIG. 33 showing the valve disc position on the suction stroke.
Figure 35:
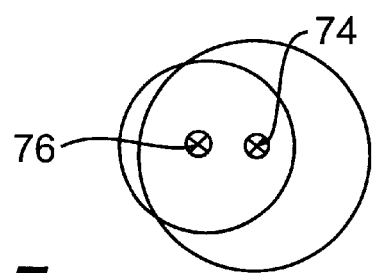
FIG. 35 is a view similar to FIG. 3, but showing throw data for conventional cylinder.
Figure 36:
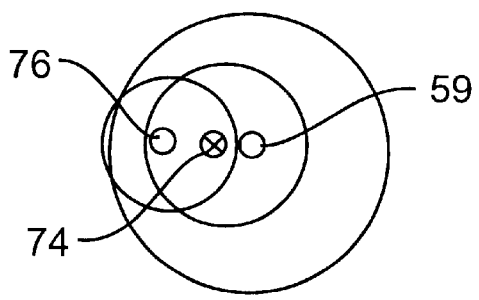
FIG. 36 is a view similar to FIG. 35, but showing throw data for one preferred adjustable throw cylinder in accordance with the present invention.

Referring particularly to FIGS. 32–34 and with reference to claims 19–24, a highly preferred pressure regulating means comprises a suction valve structure generally designated 139 having a free-floating valve disc 140 and a suction port seat 141, wherein said disc is comprised of resilient, pressure deformable material and is mounted in the piston head 142 such that a sealing face 143 of said disc is normally slightly spaced from a cooperating sealing face 144 of said seat to provide a pressure let-down passage 145, said disc being deformable by the pressure in the compression chamber 105 on the compression stroke whereby said faces which are preferably annular contact each other and form a compression seal.

The disc 140 is pressure deformable, semi-rigid, highly resilient and comprised of material selected from one or a blend of polyamide, polyimide, poly (amide-imide), polycarbonate, polystyrene, polytetrafluoroethylene, cellulose ester, polyester, vinyl polymers, polyolefin, or copolymers thereof.

The leak path 145 can range in width, i.e., the distance between the two faces 143, 144, from e.g., about 0.001 in. to about 0.02 in. or more, depending on the COL desired and the materials of construction of the disc.

The invention has been described in detail with particular reference to preferred embodiments thereof, but it will be understood that variations and modifications will be effected with the spirit and scope of the invention.

We claim:

1. A variable capacity gas compressor having a block formed with a plurality of cylinders having discharge ends, each said cylinder having a piston reciprocably mounted therein, a head mounted on said block over said discharge ends to provide in cooperation with each said piston a compression chamber, a suction valve and a discharge valve on said compressor and adapted to place each said compression chamber in communication with the low side and high side respectively of said compressor, a crankshaft rotatably mounted on said block and having a rotational axis and a plurality of crankpins formed thereon, a separate connecting rod for each said piston and having opposite end portions, one said end portion of each said connecting rods having a bearing mounted on a crankpin, and the other said end portion of each said connecting rods engaging an associated piston, at least one of said crankpins being complex and having an eccentric cam having a radially inner bearing surface rotatably mounted on an inner shaft of said crankpin and having a radially outer journal surface serving as a journal for the bearing of said connecting rod, at least one stop on said crankshaft at one or more predesigned angular positions about said rotational axis of said crankshaft, at least one dog on said cam at one or more predesigned angular positions about a rotational axis of said cam, said stop and dog defining end points of rotatability of said cam on said crankpin shaft, reversible motor means on said compressor for driving said crankshaft selectively in either rotational direction about its rotational axis in accordance with operational signals transmitted thereto, said cam being rotatable to one said end point upon rotation of said crankshaft in one direction and to the other end point upon rotation of said crankshaft in the reverse direction, said stop and dog forming a junction at each said end point, and stabilizing means for at least one of said junctions and comprising at least one means selected from the group consisting of:

(A) positive lock means for selectively locking said crankshaft to said cam, said positive lock means selected form the group consisting of
 (a) latching means having cooperating elements on said crankshaft and cam, said elements being engageable and disengageable at least at one of said end points by the application of or the release of, respectively, centrifugal force applied to an element of said latching means, or
 (b) pressure differential operable means having cooperating elements on said crankshaft and cam, said elements being engageable and disengageable by rapid and opposite angular motion respectively between said crankpin shaft and cam at least at one of said end points;

(B) friction drag means having cooperating elements on said cam and said crankpin shaft and being engageable to resist destabilizing forces tending to rotate said cam on said crankpin shaft and separate the junction at least at one of said endpoints; and (C) pressure regulating means which functions to minimize any differential in pressure between the low side of the compressor and the compression chamber of a cylinder which is in a passive mode.

2. The compressor of claim 1 wherein said stabilizing means comprises the combination of a cam structure configured to provide a centrifugal force torque at 3600 rpm of from about 5 to about 50 in lb, and a suction valve structure having a Coefficient-Of-Leakage of from about 0.03 to about 0.5.

3. The compressor of claim 2 wherein said shaft of each said complex crankpin has a center axis, and its associated piston has a reciprocation axis, and said cam structure has a center of gravity and a cam apex, wherein said rotational axis and said center axis lie in an orbital plane, wherein said center of gravity is angularly displaced from said orbital plane whereby a junction closing centrifugal force torque is generated upon rotation of said crankshaft, and wherein said stop and dog are positioned with respect to each other whereby at one said end point said apex and said reciprocation axis both lie substantially in said orbital plane and said apex is proximal to said associated piston whereby said piston is pacified.

4. The compressor of claim I wherein said latching means comprises an arm pivotally mounted on a portion of said crankshaft for swinging motion toward or away from said dog in response to acceleration or deceleration of rotational motion of said crankshaft, wherein said arm is provided with shoulder means for engaging a surface of said dog and retaining said dog at said junction during rotation of said crankshaft in one direction.

5. The compressor of claim 4, wherein the pivotal mounting for said arm provides a pivotal axis which is substantially perpendicular to said rotational axis of said crankshaft.

6. The compressor of claim 4, wherein said portion of said crankshaft comprises a bushing which is keyed to said crankshaft adjacent said cam.

7. The compressor of claim 1 wherein said motor means is provided with separate run and start windings and wherein electrical switching means is provided for taking said motor means off of said run winding and placing it on said start winding upon reversal of said motor means rotation to pacify one or more of said cylinders.

8. The compressor of claim 1 wherein said pressure regulating means comprises a suction valve structure having a free-floating valve disc and a suction port seat, wherein said disc is comprised of resilient, pressure deformable material and is mounted in the piston head such that a sealing face of said disc is normally slightly spaced from a cooperating sealing face of said seat to provide a pressure let-down passage, said disc being deformable by the pressure in the compression chamber on the compression stroke whereby said faces contact each other and form a compression seal.

9. The compressor of claim 8 wherein said disc is pressure deformable, semi-rigid, highly resilient and comprised of material selected from one or a blend of polyamide, polyamide, poly (amide-imide), polycarbonate, polystyrene, polytetrafluoroethylene, cellulose ester, polyester, vinyl polymers, polyolefin, or copolymers thereof.

10. The compressor of claim 8 wherein the seating face of said disc, and the sealing face of said seat are annular in configuration, and wherein said valve structure has a Coefficient-Of-Leakage of from about 0.05 to about 0.35.

11. The compressor of claim 10 wherein said disc is structured to become deformed and allow said faces to form a gas seal at a pressure within the compression chamber above about 25 psig.

12. The compressor of claim 11 wherein said cam is configured to provide a centrifugal force torque at 3600 rpm of from about 10 to about 50 in.lb.

13. The compressor of claim 12 wherein said cam means has a cam lobe apex and is provided with a pair of dogs angularly spaced about its rotational axis, and said crankshaft is provided with a single stop angularly positioned thereon, and wherein the angular positioning of said dogs and stop align the rotational axis of the crankshaft and the center axis of the crankpin shaft with the apex of the cam lobe at each said end point.

14. A variable capacity gas compressor having a block with a plurality of cylinders formed therethrough, said cylinders having open discharge ends, a piston reciprocably mounted in each said cylinder, a valve plate mounted on said block over the open ends of said cylinders and defining, with said pistons a plurality of compression chambers, said plate having a plurality of discharge valves adapted to place said compression chambers in communication with the high side of said compressor, a plurality of suction valves on said compressor adapted to place said compression chambers in communication with the low side of said compressor, a crankshaft rotatably mounted on said block and having a rotational axis and a plurality of crankpins formed thereon, a connecting rod for each said piston and each hating a bearing mounted on a crankpin and a wrist pin mounted on an associated piston, at least one of said crankpins being complex and having an eccentric cam rotatably mounted on an inner shaft of said crankpin and serving as a journal for said bearing means, at least one stop element on said crankshaft at one or more predesigned angular positions, at least one dog element on said cam at one or more predesigned angular positions, said stop and dog elements defining end points of rotatability of said cam on said crankpin shaft, a reversible motor on said compressor for driving said crankshaft selectively in either rotational direction in accordance with operational signals transmitted thereto, said cam being rotatable to one said end point upon rotation of said crankshaft in one direction and to the other end point upon rotation of said crankshaft in the reverse direction, said stop and dog elements forming a junction at each said end point, and a stabilizing structure for at least one of said junctions and comprising at least one structure selected from the group consisting of:

(A) a positive lock structure selected from the group consisting of
  (a) a latching device having cooperating elements on said crankshaft and cam means, said elements being engageable and disengageable at least at one of said end points by the application of or the release of, respectively, centrifugal force applied to one of said elements, or
  (b) a pressure differential operable device having cooperating elements on said crankshaft and cam means, said elements being engageable and disengageable by sudden and opposite angular motion respectively between said crankpin shaft and cam at least at one of said end points;

(B) a friction drag device having cooperating elements on said cam and said crankpin shaft and being engageable to resist destabilizing forces tending to rotate said cam on said crankpin shaft and separate the junction at least at one of said endpoints; and (C) a pressure regulating device which functions to minimize any differential in pressure between the low side of the compressor and the compression chamber of a cylinder which has been placed in a passive mode.

15. The compressor of claim 14 wherein said stabilizing structure comprises the combination of a cam structure providing a centrifugal force torque at 3600 rpm of from about 10 to about 50 in lb, and a suction vale structure having a Coefficient-Of-Leakage of from about 0.05 to about 0.35.

16. The compressor of claim 15 wherein said crankshaft has a rotational axis, the shaft of each said complex crankpin has a center axis and its associated piston has a reciprocation axis, and said cam structure has a center of gravity and a cam apex, wherein said rotational axis and said center axis lie in an orbital plane, wherein said center of gravity is angularly displaced from said orbital plane whereby a junction closing centrifugal force torque is generated upon rotation of said crankshaft, and wherein said stop and dog elements are positioned with respect to each other whereby at one said end point said apex and said reciprocation axis both lie substantially in said orbital plane and said apex is proximal to said associated piston whereby said piston is pacified.

17. The compressor of claim 14 wherein said latching device comprises an arm pivotally mounted on a portion of said crankshaft for swinging motion toward or away from said dog element in response to acceleration or deceleration of rotational motion of said crankshaft, wherein said arm is provided with shoulder structure for engaging a surface of said dog element and retaining said dog, element at said junction during rotation of said crankshaft in one direction.

18. The compressor of claim 17 wherein the pivotal mounting for said arm provides a pivotal axis which is substantially perpendicular to said rotational axis of said crankshaft.

19. The compressor of claim 17 wherein said portion of said crankshaft comprises a bushing which is keyed to said crankshaft adjacent said cam.

20. The compressor of claim 8 wherein said motor is provided with separate run and start windings and wherein an electrical switching mechanism is provided for taking said motor means off of said run grinding and placing it on said start winding upon reversal of said motor rotation to pacify one or more of said cylinders.

21. A two stage reciprocating compressor comprising:
   a block having at least one cylinder and an associated compression chamber and piston;
   a crankshaft including an eccentric crankpin;
   a reversible motor for rotating the crankshaft in a forward and a reverse direction;
   an eccentric, two position cam rotatably mounted over the crankpin, said cam rotating to and operating at a first position relative to said crankpin when the motor is running in the forward direction and rotating to and operating at a second position relative to said crankpin when the motor is running in the reverse direction,
   the eccentricities of said crankpin and said cam combining to cause the piston to have a first stroke when the motor operates in the forward direction and a second stroke when the motor operates in the reverse direction, said second stroke being less, than the first stroke;
   a control for selectively operating said motor either in the forward direction at a first preselected, fixed speed associated with a first power load or in the reverse direction at a second preselected, fixed speed associated with a second power load, both of said second speed and power load being less than the respective said first speed and power load; and
   a mechanical system for restraining the movement of said cam away from the first position when the motor is running in the forward direction.

22. The compressor of claim 21 wherein the motor is an induction motion having start and run windings and wherein said motor operates in the forward direction on the run winding and operates in the reverse direction on the start winding.

23. The compressor of claim 22 wherein the block includes at least two cylinders, one of which has a piston driven by the combined eccentric crankpin and cam combination and the other of which has a piston driven solely by a second crankpin on the crankshaft.

24. The compressor of claim 21 further comprising a first stop mechanism for restricting the relative rotation of said cam about said crankpin when the motor is running in the forward direction, and a second stop mechanism for restricting the relative rotation of said cam about said crankpin when the motor is running in the reverse direction.

25. The compressor of claim 24 wherein said first stop mechanism comprise., a stop on said crankshaft and a corresponding dog on said cam.

26. The compressor of claim 25 wherein said second stop mechanism comprises a stop on said crankshaft and a corresponding dog on said cam.

27. The compressor of claim 21 wherein said cam is designed to produce a centrifugal force torque in the range of 10 to 50 in lbs. at a crankshaft rotational speed of 3600 rpm.

28. A two stage reciprocating compressor comprising.
   a block having a first cylinder and a second cylinder, each of the first and second cylinders having an associated compression chamber and piston,
   a crankshaft including an eccentric crankpin and a second crankpin for driving the piston in the second cylinder;
   a reversible induction motor having start and run windings, the motor operating on the run winding to rotate the crankshaft in a forward direction and on the start winding to rotate the crankshaft in a reverse direction;
   an eccentric, two position cam rotatable mounted over the crankpin, said cam rotating to and operating at a first position relative to said crankpin when the motor is running in the forward direction and rotating to and operating at a second position relative to said crankpin when the motor is running in the reverse direction,
   the eccentricities of said crankpin and said cam combining to cause the piston in the first cylinder to have a first stroke when the motor operates in the forward direction and a second stroke when the motor operates in the reverse direction, said second stroke being less than the first stroke;
   a control for selectively operating said motor either in the forward direction at a first preselected, fixed speed associated with a first sower load or in the reverse direction at a second preselected, fixed speed associated with a second power load, both of said second speed and power load being less than the respective said first speed and power load; and
   a mechanical system for restraining the movement of said cam away from the first position when the motor is running in the forward direction.

29. The compressor of claim 28 wherein said mechanical system includes cooperating elements on said crankshaft and said cam.

30. The compressor of claim 29 wherein said cooperating elements form a releasable latch.

31. The compressor of claim 29 wherein said elements frictionally engage each other to provide a frictional drag sufficient to restrain such movement.

32. The compressor of claim 28 wherein said mechanical system includes an eccentric mass formed on one side of said cam to generate a centrifugal force biasing said cam toward said first position when the motor is running in the forward direction.

33. The compressor of claim 32 wherein the eccentric mass is generally in the shape of a C.

34. A two stage reciprocating compressor comprising:
   a block having at least one cylinder and an associated compression chamber and piston;
   a crankshaft including an eccentric crankpin;

a reversible motor for rotating the crankshaft in a forward and a reverse direction;

an eccentric, two position cam rotatably mounted over the crankpin, said cam rotating to and operating at a first position relative to said crankpin when the motor is running in the forward direction and rotating to and operating at a second position relative to said crankpin when the motor is running in the reverse direction, the eccentricities of said crankpin and said cam combining to cause the piston to have a first stroke when the motor operates in the forward direction and a second stroke when the motor operates in the reverse direction, said second stroke being less than the first stroke;

a control for selectively operating said motor either in the forward direction at a first preselected, fixed speed associated with a first power load or in the reverse direction at a second preselected, fixed speed associated with a second power load, both of said second speed and power load being less than the respective said first speed and power load; and a pressure relief system for relieving any significant pressure differential between the low side of the compressor and the compression chamber of the pacified piston when the motor rotates in the reverse direction.

35. The compressor of claim 34 wherein said crankpin and cam are configured so that the second stroke of the piston driven by the crankpin and cam is substantially zero and the piston is pacified when the motor rotates in the reverse direction.

36. The compressor of claim 34 wherein said pressure relief system includes a vent in fluid communication with the compression chamber associated with the pacified piston and in fluid communication with the low side of the compressor.

37. The compressor of claim 34 wherein said pressure relief system includes a suction valve for the compression chamber associated with the pacified piston, said valve being biased to an open position and in fluid communication with the low pressure side of the compressor.

38. The compressor of claim 34 wherein said pressure relief system includes at least one aperture formed in the valve plate for the compression chamber associated with the pacified piston, said aperture being in fluid communication with the low side of the compressor.

39. The compressor of claim 34 wherein said pressure relief system includes a passage formed in the block of the compressor and in fluid communication with both the compression chamber associated with the piston and the low side of the compressor.

40. The compressor 39 wherein said passage has one end positioned at approximately the mid point of the full stroke of the piston.

41. The compressor of claim 38 wherein said pressure relief system has a Coefficient-Of-Leakage within the range of 0.05 to 0.35.

42. A two stage reciprocating compressor comprising:

a block having at least two cylinders in the block, the first cylinder having an associated first compression chamber and a piston and the second cylinder having an associated second compression chamber and piston;

a reversible motor for rotating in a forward and a reverse direction, a mechanical system between the motor and the pistons that causes both pistons to reciprocate within the cylinders at their respective full strokes when the motor is rotated in the forward direction and that causes the first piston to reciprocate at full stroke and the second piston to have a substantially zero stroke, when the motor is rotated in the reverse direction;

a control for selectively operating said motor in the forward direction at a first preselected, fixed speed associated with a first power load or in the reverse direction at a second preselected, fixed speed associated with a second power load, both of said second speed and power load being less than the respective said first speed and power load; and a pressure relief system associated with the compression chamber of the second piston for relieving any pressure differential between the low side of the compressor and the compression chamber of the second piston when the motor rotates in the reverse direction.

43. The compressor of claim 42 wherein said mechanical system includes:

a crankshaft connected to said reversible motor, said crankshaft having a first crankpin associated with the first piston and a second crankpin associated with the second crankpin; and an eccentric, two position cam rotatably mounted over the second crankpin, said cam rotating to and operating at a first position relative to said second crankpin when the motor is rotating in the forward direction and rotating to and operating at a second position relative to said second crankpin when the motor is rotating in the reverse direction.

44. The compressor of claim 43 further comprising a restraining system for restraining the movement of the eccentric cam away from the first position when the motor is running in the forward direction.

45. The compressor of claim 44 wherein said restraining system includes an eccentric mass formed on one side of said cam to generate a centrifugal force biasing said cam to said first position when the motor is rotating in the forward direction.

46. The compressor of claim 45 wherein the motor is an induction motion having start and run windings and wherein said motor operates in the forward direction on the run winding and operates in the reverse direction on the start winding.

* * * * *

UNITED STATES PATENT AND TRADEMARK OFFICE
CERTIFICATE OF CORRECTION

PATENT NO. : 6,092,993
DATED : July 25, 2000
INVENTOR(S) : Young et al.

It is certified that error appears in the above-identified patent and that said Letters Patent is hereby corrected as shown below:

Column 15,
Line 44, change "polyamide" (second occurrence) to -- polyimide --.

Column 16,
Line 12, change "hating" to -- having --.

Column 17,
Line 13, after "dog" delete ",".
Line 22, change "claim 8" to -- claim 14 --.
Line 45, after "less" delete ",".

Column 18,
Line 6, change "comprise.," to -- comprises --.
Line 41, change "sower" to -- power --.

Column 19,
Line 53, change "claim 38" to -- claim 34 --.

Signed and Sealed this

Eleventh Day of March, 2003

JAMES E. ROGAN
*Director of the United States Patent and Trademark Office*